US009922148B2

(12) United States Patent
Maturana et al.

(10) Patent No.: US 9,922,148 B2
(45) Date of Patent: *Mar. 20, 2018

(54) DYNAMICALLY SELECTING MASTER CLOCK TO MANAGE NON-LINEAR SIMULATION CLOCKS

(71) Applicant: Rockwell Automation Technologies, Inc., Mayfield Heights, OH (US)

(72) Inventors: Francisco P. Maturana, Mayfield Heights, OH (US); Kenwood H. Hall, Hudson, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 443 days.

This patent is subject to a terminal disclaimer.

(21) Appl. No.: 14/533,982

(22) Filed: Nov. 5, 2014

(65) Prior Publication Data

US 2015/0066469 A1 Mar. 5, 2015

Related U.S. Application Data

(63) Continuation of application No. 12/896,506, filed on Oct. 1, 2010, now Pat. No. 8,909,509.

(51) Int. Cl.
*G06F 17/50* (2006.01)
*H04J 3/06* (2006.01)
(Continued)

(52) U.S. Cl.
CPC ............ *G06F 17/5022* (2013.01); *G06F 1/10* (2013.01); *G06F 1/12* (2013.01); *G06F 2217/62* (2013.01);
(Continued)

(58) Field of Classification Search
None
See application file for complete search history.

(56) References Cited

U.S. PATENT DOCUMENTS 3,688,201 A * 8/1972 Pommerening ....... H03L 7/0992
324/76.82
3,936,604 A * 2/1976 Pommerening ....... H04J 3/0688
327/12
(Continued)

OTHER PUBLICATIONS

C. S. Li, Y. Ofek, "Distributed Source-Destination Synchronization Using Inband Clock Distribution", pp. 153-161, IEEE 1996.*
(Continued)

*Primary Examiner* — Kibrom K Gebresilassie
(74) *Attorney, Agent, or Firm* — Amin, Turocy & Watson, LLP

(57) ABSTRACT

Systems and methods that efficiently simulate controlled systems are presented. A simulation management component (SMC) controls simulation of a controlled system by controlling a desired number of nodes, each comprising a controller (e.g., soft controller) and a simulated component or process, which are part of the controlled system. The simulation can be performed in a step-wise manner, wherein the simulation can comprise a desired number of steps of respectively desired lengths of time. For each step, the SMC dynamically selects a desired clock (e.g., currently identified slowest clock) as a master clock for the next step. The SMC predicts a length of time of the next step to facilitate setting a desired length of time for the next step based in part on the predicted length of time. As part of each step, components can synchronously exchange data via intra-node or inter-node connections to facilitate simulation.

20 Claims, 16 Drawing Sheets

(51) Int. Cl.
*G06F 1/12* (2006.01)
*H04N 21/242* (2011.01)
*G06F 1/10* (2006.01)

(52) U.S. Cl.
CPC .......... *H04J 3/0638* (2013.01); *H04J 3/0641* (2013.01); *H04J 3/0688* (2013.01); *H04N 21/242* (2013.01)

(56) References Cited

U.S. PATENT DOCUMENTS

| | | | |
|---|---|---|---|
| 4,815,110 A * | 3/1989 | Benson | H04J 3/0664 370/508 |
| 5,254,888 A | 10/1993 | Lee et al. | |
| 5,274,545 A | 12/1993 | Allan et al. | |
| 5,309,561 A | 5/1994 | Overhouse et al. | |
| 5,488,613 A * | 1/1996 | Sridhar | G01R 31/318552 714/731 |
| 5,533,032 A | 7/1996 | Johnson | |
| 5,774,704 A | 6/1998 | Williams | |
| 5,862,361 A | 1/1999 | Jain | |
| 6,052,363 A | 4/2000 | Koch | |
| 6,078,225 A | 6/2000 | Bontekoe et al. | |
| 6,646,645 B2 | 11/2003 | Simmonds et al. | |
| 6,782,064 B1 * | 8/2004 | Schwake | G06F 1/12 375/354 |
| 6,819,150 B1 | 11/2004 | Santosa et al. | |
| 6,941,485 B2 | 9/2005 | Nomura et al. | |
| 7,114,091 B2 | 9/2006 | Vrancic | |
| 7,210,052 B2 | 4/2007 | Lee et al. | |
| 7,382,824 B1 | 6/2008 | Marmash et al. | |
| 7,460,989 B2 | 12/2008 | Ban | |
| 7,840,928 B1 | 11/2010 | Datta et al. | |
| 8,265,917 B1 | 9/2012 | Ou et al. | |
| 8,909,509 B2 * | 12/2014 | Maturana | G06F 17/5022 703/13 |
| 2002/0023239 A1 | 2/2002 | Nomura et al. | |
| 2003/0056137 A1 * | 3/2003 | Huelskamp | A61N 1/372 713/600 |
| 2003/0235216 A1 * | 12/2003 | Gustin | H04J 3/0697 370/509 |
| 2004/0062278 A1 | 4/2004 | Hadzic et al. | |
| 2005/0071703 A1 * | 3/2005 | Lee | G06F 11/1479 713/400 |
| 2005/0258881 A1 * | 11/2005 | Schultz | G06F 1/10 327/161 |
| 2006/0267640 A1 | 11/2006 | Travis | |
| 2007/0019648 A1 | 1/2007 | Robinson et al. | |
| 2007/0058478 A1 | 3/2007 | Murayama | |
| 2008/0068103 A1 | 3/2008 | Cutler | |
| 2008/0069150 A1 | 3/2008 | Badt et al. | |
| 2008/0122986 A1 | 5/2008 | Diederichsen | |
| 2009/0016475 A1 | 1/2009 | Rischar et al. | |
| 2009/0089030 A1 * | 4/2009 | Sturrock | G06F 17/5009 703/7 |
| 2010/0019811 A1 | 4/2010 | Sun et al. | |
| 2010/0098111 A1 * | 4/2010 | Sun | H03L 7/0807 370/509 |
| 2010/0111113 A1 * | 5/2010 | Wong | H04J 3/14 370/503 |
| 2011/0019699 A1 | 1/2011 | Sun et al. | |
| 2011/0164881 A1 * | 7/2011 | Rajagopal | H04B 10/1149 398/128 |
| 2011/0255546 A1 * | 10/2011 | Le Pallec | H04J 3/0679 370/400 |
| 2012/0084062 A1 * | 4/2012 | Maturana | G06F 17/5022 703/6 |
| 2012/0252503 A1 | 10/2012 | Wu | |
| 2013/0148639 A1 | 6/2013 | Gao et al. | |
| 2015/0137862 A1 * | 5/2015 | Bahl | G01R 31/318552 327/145 |

OTHER PUBLICATIONS

C. S. Li, Y. Ofek, "Distributed Source-Destination Synchronization using Inband Clock Distribution" pp. 153-161. IEEE (Year: 1996).*

Notice of Allowance dated Aug. 5, 2014 for U.S. Appl. No. 12/896,506, 23 pages.

Li et al., "Distributed Source-Destination Synchronization Using Inband Clock Distribution", IEEE Journal on selected areas in communications, vol. 14, No. 1, Jan. 1996. Retrieved on Aug. 26, 2013, 9 pages.

Office Action dated Mar. 21, 2014 for U.S. Appl. No. 12/896,506, 23 pages.

Office Action dated Aug. 26, 2013 for U.S. Appl. No. 12/896,506, 26 pages.

Eidson, "IEEE-1588 Standard Version 2-A Tutorial," Agilent Technologies, Oct. 2, 2006, 21 pages.

"IEEE Standard for a precision Clock Synchronization Protocol for Networked Measurement and Control Systems", IEEE Instrumentation and Measurement Society, Jul. 24, 2008, 289 pages.

* cited by examiner

DYNAMICALLY SELECTING MASTER CLOCK TO MANAGE NON-LINEAR SIMULATION CLOCKS

CROSS-REFERENCE TO RELATED APPLICATION

This application is a continuation application of, and claims the benefit of priority to, U.S. patent application Ser. No. 12/896,506, entitled "DYNAMICALLY SELECTING MASTER CLOCK TO MANAGE NON-LINEAR SIMULATION CLOCKS," filed on Oct. 1, 2010, the entirety of which is incorporated herein by reference.

TECHNICAL FIELD

The subject specification relates generally to industrial control systems and, more particularly, to dynamically selecting master clock time to facilitate managing non-linear simulation clocks.

BACKGROUND

Simulation and testing of controlled systems, such as plants or processes, which are desired to be controlled, and controllers that control them, can be a useful way to facilitate system design and creation in an efficient manner. The simulation and testing of a controlled system to optimize the system typically can save time and expense over actually implementing the controlled system and then attempting to optimize it. In a simulation, a controller and/or soft controller (e.g., controller emulator) can be associated with a desired simulated component(s) or process(es) to model a desired controlled system, wherein the design of the system, including the controller or soft controller, can be modified to optimize the system before actually implementing the system with a real component(s) or process(es). The controller and simulated components or processes each can be associated with respective clocks, wherein the simulation typically is performed in discrete steps (e.g., fixed steps) or time intervals. When desired (e.g., at the end of each step), data relating to events that occurred during the execution of the simulation over the desired time period can be exchanged between the controller and simulated components or processes, and the simulation can proceed to the next step, wherein the simulation can continue until a desired end point is reached.

During simulation, it can be desirable (e.g. necessary) to have synchronization of the various clocks and synchronization of the various data exchanges that occur as part of the simulation in order to accurately simulate the control system. Conventionally, an IEEE 1588 Precision Time Protocol (PTP) can be employed for synchronization in simulated control systems. The IEEE 1588 standards provide for a hierarchal master-slave architecture for clock distribution. When employing the IEEE 1588 standards, a clock in the system having the best quality is typically chosen to be the master clock. For instance, if a current master clock is based on ordinary time, and another clock in the system is then connected to a clock based on a Global Positioning System (GPS) system, which can be of higher quality than the ordinary time source of the current master clock, the clock associated with the GPS system can become the new master clock for the system.

In simulations, the respective clocks in the system are often unstable in relation to each other, as some clocks may run slower than other clocks during the simulation. To facilitate clock synchronization, typically, one clock associated with the system is selected to be a master clock, wherein it can be desirable to select the slowest clock to be the master clock. Often, the clock associated with a simulated component or process will be the slowest clock in the system, since the other clocks (e.g., slave clocks), which are faster, can be synchronized to the slowest clock.

Conventionally, simulation of smaller scale control systems, for example, using a single workstation and a single workstation simulation/control synchronization tool, has been achieved with some degree of success. However, today, many control systems are larger and more complex, and can comprise a number of subsystems that have to interact with each other. One problem with simulations of a larger, complex control system is that it is more difficult to synchronize clocks for the respective controllers and components, due in part to the complexity of distributed simulations with physical separation, which can result in the time progression of simulation nodes tending to run slower than wall clock time. For instance, depending on the system being simulated, during a time step, a first clock associated with a first simulated component may run slower than a second clock associated with a second simulated component; but during a subsequent time step, the first clock may run faster than the second clock. As a result, clock synchronization can be negatively impacted and the simulated system may never converge. Further, data exchange synchronization can be negatively impacted as well. The current IEEE 1588 standards are not effective in controlling clock synchronization and data exchange synchronization, in part because such synchronization tries to speed up the nodes in an attempt to advance (e.g., catch up) to synchronize with the master clock, which is operating at wall clock time. As a result, the system can never converge.

Another issue that can negatively impact system simulations is the variances in lengths of steps. For instance, if a 10 millisecond (ms) step is desired, a clock may run for more than 10 ms (e.g., 11 ms, 12 ms, 13 ms, . . . ) or less than 10 ms (e.g., 9 ms, 8 ms, 7 ms, . . . ), instead of the desired 10 ms. This issue and the problems with regard to unstable clocks in simulations of larger controlled systems can result in the system simulations taking a significantly longer time to be performed than desired. Currently, there is no way to efficiently simulate larger, more complex controlled systems, and no way to account for variances in the time lengths of steps in controlled system simulations, among other problems with conventional system simulations.

The above-described deficiencies of today's controlled system simulations are merely intended to provide an overview of some of the problems of conventional systems, and are not intended to be exhaustive. Other problems with the state of the art and corresponding benefits of some of the various non-limiting embodiments may become further apparent upon review of the following detailed description.

SUMMARY

The following presents a simplified summary of the disclosed subject matter in order to provide a basic understanding of some aspects described herein. This summary is not an extensive overview, and is not intended to identify key/critical elements or to delineate the scope of the disclosed subject matter. Its sole purpose is to present some concepts in a simplified form as a prelude to the more detailed description that is presented later.

Systems and methods that can efficiently simulate controlled systems, such as plants or processes, which are desired to be controlled, and controllers that control them, are presented. A simulation management component (SMC) can control simulation of a controlled system (e.g., can control execution of a control system emulation connected to a plant or process simulation) by controlling a desired number of nodes, each comprising a controller(s) (e.g., soft controller) and a simulated component(s) or process(es), which are part of the simulated controlled system. The simulation can be performed in a step-wise manner, wherein the simulation can comprise a desired number of steps of respectively desired lengths of time. In an aspect, for each node, the SMC can comprise a coordinator agent (CA) and a federated agent (FA) that can be associated with the controller(s) and simulation component(s) in that node, wherein the CA, FA, controller(s) and simulation component(s) can form a workstation cluster.

A CA can facilitate synchronized data exchanges and clock synchronization, and can control progression of runtime execution of the associated controller(s) and simulation component(s). The CA and FA in a workstation cluster can coordinate to adjust the precision clock state in a periodic manner. The CA also can identify clock deviations (e.g., slower running clock) and can send a relocation clock exception message to the associated FA in the workstation cluster to facilitate clock synchronization and dynamic selection of a master clock. The FAs of the respective workstation clusters can coordinate in the domain cluster to identify or calculate time progression errors, adjust a pseudo master clock entity, and synchronize the clocks associated with the simulated controlled system.

In an aspect, each component (e.g., controller, simulation device) can be associated with a respective clock. The SMC can employ a modified Institute of Electrical and Electronics Engineers (IEEE) 1588 Precision Time Protocol (PTP) (IEEE 1588 PTP) to facilitate synchronous performance of the simulation, wherein, for example, instead of using the best quality clock as a master clock, the SMC can dynamically select a slowest clock over the last step to serve as the master clock for the next step. When the step of a simulation is performed, the SMC, comprising the respective CAs and FAs, can analyze the clocks to identify which clock in the simulated controlled system was operating the slowest relative to the other clocks for the last step. At desired times (e.g., for each step), the SMC can dynamically select a desired clock, such as a currently identified slowest clock, to be a master clock for the next step of the simulation to facilitate clock synchronization and data exchange synchronization.

In another aspect, at desired times (e.g., for each step), the SMC can facilitate a synchronous data exchange between components. During execution of the controlled system simulation, pieces of data (e.g., data packets) can be generated in relation to the controlled system simulation. The SMC can associate a respective time with each piece of data to facilitate synchronous data exchange. For instance, respective time stamps can be associated with or inserted into respective pieces of data, wherein the time on the time stamp can relate to the time in the controlled system simulation that the event associated with the data occurred. When generated, pieces of data can reside in a producer queue of the component that generated the pieces of data. At the desired time, the pieces of data in the producer queue can be sent to a desired component(s), wherein the desired component(s) can receive the piece(s) of data and can store the piece(s) of data in a consumer queue. The data exchange can be intra-node exchange or inter-node exchange. The queue component associated with the receiving component(s) can re-arrange the pieces of data in the consumer queue in a time-based order based at least in part on the respective associated times for the respective pieces of data (e.g., oldest piece of data can be placed first in the consumer queue, followed by successively newer pieces of data, with the newest piece of data being placed last in the consumer queue). Each component can utilize the pieces of data in its consumer queue in the desired time-based order as the control system simulation proceeds.

In another aspect, the SMC can predict (e.g., adaptively predict) a length of time of the next step to facilitate setting a desired length of time for the next step based at least in part on historical information relating to time to execute simulation steps in the controlled system simulation. In an embodiment, the SMC can include a predictor component that employs a desired adaptive filter (e.g., Kalman filter, filter employing fuzzy logic, LaGrange interpolation filter, etc.), wherein the predictor component can receive and analyze information relating to time slices (e.g., lengths of time) associated with various components of the simulated controlled system. The predictor component can generate and provide a predicted length of time for the next step based at least in part on information analysis, and the length of time of the next step can be set based at least in part on the predicted length of time for the next step (e.g., the length of time of the next step can be the predicted length of time or can be determined as a function of the predicted length of time). Employing the predictor component, the amount of time to perform controlled system simulations can be reduced as compared to conventional systems and methods for controlled system simulation. The disclosed subject matter can desirably perform accurate controlled system simulations, including simulations of larger, more complex controlled systems, while also decreasing the length of time to perform controlled system simulations.

To the accomplishment of the foregoing and related ends, certain illustrative aspects of the disclosed subject matter are described herein in connection with the following description and the annexed drawings. These aspects are indicative, however, of but a few of the various ways in which the principles of the disclosed subject matter can be employed and the disclosed subject matter is intended to include all such aspects and their equivalents. Other advantages and distinctive features of the disclosed subject matter will become apparent from the following detailed description of the disclosed subject matter when considered in conjunction with the drawings.

DETAILED DESCRIPTION

Figure 1:
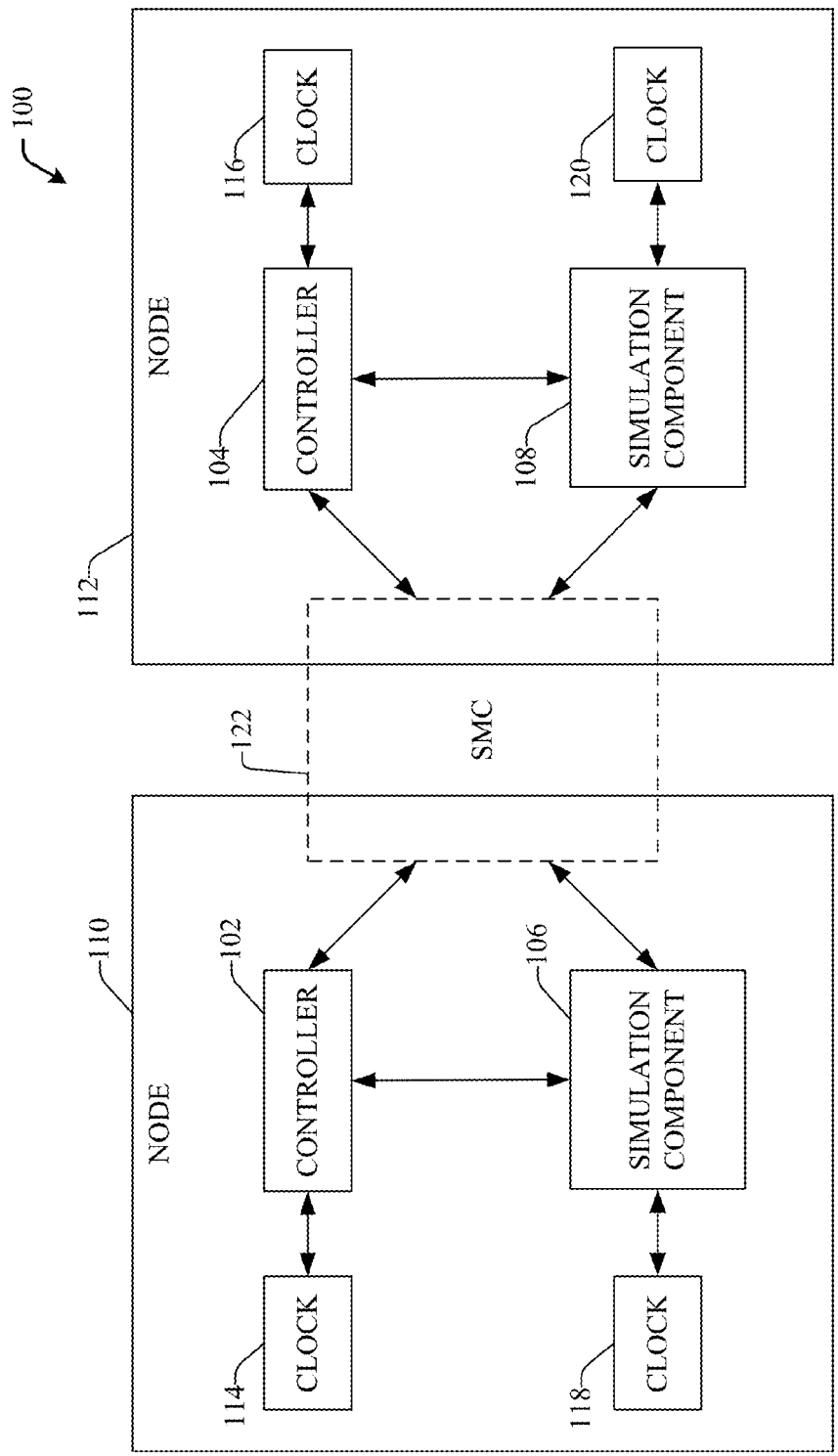
FIG. 1 a block diagram of an example system that can facilitate management of controlled system simulation in accordance with various aspects and embodiments of the disclosed subject matter.

The disclosed subject matter is now described with reference to the drawings, wherein like reference numerals are used to refer to like elements throughout. In the following description, for purposes of explanation, numerous specific details are set forth in order to provide a thorough understanding of the disclosed subject matter. It may be evident, however, that such matter can be practiced without these specific details. In other instances, well-known structures and devices are shown in block diagram form in order to facilitate describing the subject matter disclosed herein.

Simulation and testing of controlled systems, such as plants or processes, which are desired to be controlled, and the controllers that control them, can be a useful way to facilitate system design and creation in an efficient manner. Conventionally, in a simulation, controllers and simulated components or processes each can be associated with respective clocks, wherein the simulation typically is performed in discrete steps (e.g., fixed steps) or time intervals. When desired (e.g., at the end of each step), data relating to events that occurred during the execution of the simulation over the desired time period can be exchanged between the controller and simulated components or processes, and the simulation can proceed to the next step, wherein the simulation can continue until a desired end point is reached. Also, during simulation, it can be desirable (e.g. necessary) to have synchronization of the various clocks and synchronization of the various data exchanges that occur as part of the simulation in order to accurately simulate the controlled system. Conventionally, an Institute of Electrical and Electronics Engineers (IEEE) 1588 Precision Time Protocol (PTP) (IEEE 1588 PTP) can be employed for synchronization in simulated controlled systems. When employing the conventional IEEE 1588 standards, a clock in the system having the best quality is typically chosen to be the master clock.

Simulation of controlled systems has generally been limited to smaller scale simulations. For larger scale, more complex controlled system simulations involving many subsystems that have to interact with each other, there can be significant problems with maintaining clock synchronization of the various clocks in the simulated controlled system in part because clocks can be unstable in relation to each other, problems with maintaining synchronous data exchanges between the various system components, and other problems. Further, the actual length of time of the steps in the controlled system simulation can be varied from the desired or expected length of time due in part to the influence the machine (e.g., computer used to perform the simulation) can have on a controller's clock.

To that end, systems and methods that can efficiently simulate controlled systems are presented. A simulation management component (SMC) can control simulation of a controlled system (e.g., can control execution of a control system emulation connected to a plant or process simulation) by controlling a desired number of nodes, each comprising a controller(s) (e.g., soft controller) and a simulated component(s) or process(es), which are part of the simulated controlled system. The simulation can be performed in a step-wise manner, wherein the simulation can comprise a desired number of steps of respectively desired lengths of time. For each step, the SMC can dynamically select a desired clock, such as a currently identified slowest clock, to be a master clock for the next step to facilitate clock synchronization and data exchange synchronization. In another aspect, the SMC can predict (e.g., adaptively predict) a length of time of the next step to facilitate setting a desired length of time for the next step based at least in part on historical information relating to time to execute simulation steps in the controlled system simulation. The disclosed subject matter can desirably perform accurate controlled system simulations, including simulations of larger, more complex controlled systems, while also decreasing the length of time to perform controlled system simulations.

Turning now to the drawings, FIG. 1 illustrates a block diagram of an example system 100 that can facilitate management of controlled system simulation in accordance with various aspects and embodiments of the disclosed subject matter. The system 100 can include a desired number of controllers (e.g., soft controllers), such as controller 102 and controller 104, that can facilitate controlling operations of components and processes in a controlled system (e.g., a plant or process, which are desired to be controlled, and associated controller(s)). It is to be noted that a controller can be a dedicated piece of hardware that is self contained or, in the case of a "soft controller", a piece of software that runs on a computer and provides controller-like control. For instance, in the case of a soft controller, code can be extracted by the soft controller to access a project database directly to extract name information. In accordance with various embodiments, a controller can be a programmable logic controller (PLC) or a soft PLC (e.g., PLC emulator).

It is to be appreciated and understood that, typically, a controller can be associated with another component(s) (also referred to as the automation device(s)), which can be, but is not limited to, a human machine interface (HMI), a computer, a disparate controller, a roller, a station, a welder, a scanner, a belt conveyor, a pusher, a pump, a press, a fan, a photo eye, etc., or any other suitable device utilized in automation systems. Furthermore, the automation device can be controlled by the controller. It is to be appreciated that the controller can contain software components and hardware components having inputs and/or outputs that can be utilized in connection with automating an industrial manufacturing device/process.

When designing a controlled system, such as a plant or process to be controlled, and associated controller(s), it can be desirable to simulate the plant or process to be controlled to analyze the behavior of the controlled system under various operating conditions to determine whether the controlled system is operating as desired. If simulated operation of the simulated controlled system is not as desired (e.g., not optimal), the simulated controlled system can be modified to facilitate achieving a desired level of operation, and a simulation of the controlled system can be executed.

In an aspect, to facilitate simulating the controlled system, system 100 can include a desired number of simulation components, such as simulation component 106 and simulation component 108, that can simulate desired components or devices (e.g., roller, conveyor, pump, etc.) of the controlled system. The simulation components (e.g., 106, 108) can be respectively associated with (e.g., connected to) controllers (e.g., 102, 104) and/or other simulation components, in accordance with the controlled system design to facilitate simulating the controlled system. For instance, simulation component 106 can be associated with controller 102 and simulation component 108 can be associated with controller 104. The system 100 can contain a desired number of nodes, such as, for example, node 110 and node 112, wherein node 110 can comprise controller 102 and simulation component 106, and node 112 can comprise controller 104 and simulation component 108. The nodes can be simulated using Matlab/Simulink simulations or SoftLogix emulations, for example. It is to be appreciated and understood that, while node 110 and node 112 are each depicted as including one controller and one simulation component, the subject specification is not so limited, as a node can have virtually any desired number of controllers and virtually any desired number of simulation components, wherein the number of controllers can be same or different from the number of simulation components, depending at least in part on the controlled system (e.g., controlled plant or process) being designed or simulated. Further, while the system 100 is depicted as having two nodes, the subject specification is not so limited, as there can be virtually any desired number of nodes (e.g., less than two nodes, two nodes, greater than two nodes) that can be employed for a controlled system simulation.

In an aspect, components associated with the controlled system can be associated with clocks to facilitate operation of such components. For instance, controller 102 can be associated with (e.g., connected to) clock 114, controller 104 can be associated with clock 116, simulation component 106 can be associated with clock 118, and simulation component 108 can be associated with clock 120, wherein the respective clocks can provide clock signals or pulses to the respective components to facilitate simulated operation of the simulated controlled system.

In accordance with various aspects and embodiments, to facilitate desired simulation of the simulated controlled system, the system 100 can comprise a simulation management component (SMC) 122 that can facilitate controlling operation of the simulation of the simulated controlled system. The SMC 122 can facilitate synchronization of the clocks 114, 116, 118 and 120, synchronization of intra-node and inter-node data exchanges, prediction of time lengths of steps in the simulation, among other features and functionality of the SMC 122, as more fully disclosed herein. In an aspect, the SMC 122 can employ a modified Institute of Electrical and Electronics Engineers (IEEE) 1588 Precision Time Protocol (PTP) (IEEE 1588 PTP) standard to facilitate synchronization of the components and associated clocks of the simulated controlled system, as more fully disclosed herein. In an aspect, the SMC 122 can be de-centralized, and thus, portions of the SMC 122 can be part of each node, including node 110, 112. It is to be appreciated and understood that, if a controlled system simulation comprises only one node, as desired, all or a desired portion of the SMC 122 can reside within that node. It is noted that, in FIG. 1, the SMC 122 is depicted as a dotted line to emphasize that the SMC 122 can be de-centralized such that portions of the SMC 122 can reside within other components, such as nodes 110 and 112, for example.

Controlled system simulations typically can be performed in a step-wise manner, wherein the simulation can be performed in steps of same or varying lengths of time. For example, a first step of a controlled system simulation that spans a first length of time can be performed, data relating to the step just performed and/or the next step to be executed can be exchanged between various controlled system components, synchronization between components can be maintained, and the controlled system can be set for the next step in the simulation, wherein the next step can span the same or different length of time than the first step. To facilitate synchronization of the clocks, a master clock is selected, wherein the SMC 122 can select a desired clock of the clocks 114, 116, 118 and 120 in the simulated controlled system. For instance, the SMC 122 can select the slowest running clock as the master clock, which can facilitate ensuring that all of the clocks 114, 116, 118 and 120 can be synchronized, since the slave clocks can be expected to operate at least as fast as the master clock.

In an aspect, for each step in a controlled system simulation, the SMC 122 can dynamically select a clock (e.g., 114, 116, 118 or 120) as a master clock based at least in part on predefined simulation criteria. For instance, the predefined simulation criteria can specify that the SMC 122 select the slowest clock over the most recent step as the master clock for the next step to be performed. With regard to the first step, the predefined simulation criteria can specify that the SMC 122 select the clock that is expected to be the slowest clock as the master clock for the first step, wherein identification of the clock expected to be the slowest clock can be based at least in part on whether a particular clock is associated with a simulation component (e.g., 106, 108), initialization or pre-testing of the controlled system simulation, prior knowledge of clock performance in relation to associated controlled system components, and/or other information or desired factors.

For instance, one approach to dynamically selecting a master clock can be as follows. After each time step of a controlled system simulation, the SMC 122 can advance simulation to counter time for the n nodes. The delta time for each of n nodes in a controlled system simulation can be calculated as delta time=local counter (at respective node)−simulation time. The SMC 122 can collect information relating to the respective delta times from the respective nodes, wherein the respective nodes can identify or calculate their respective delta times, or can provide information to the SMC 122 to enable the SMC 122 to identify or calculate the respective delta times of the respective n nodes. The SMC 122 can dynamically select a master clock for the next time step of the simulation in accordance with the equation: $CLK_{MASTER}(t+1) = \min(CLK_{1\ through\ n}(t), CLK_{MASTER}(t))$, wherein t+1 can represent the next time step of the simulation, t can represent the time step of the simulation just completed, $CLK_{MASTER}(t+1)$ can be the master clock for the next time step, $CLK_{1\ through\ n}(t)$ can be the respective times (e.g., delta times) of the clocks respectively associated with n nodes in the controlled system simulation, and $CLK_{MASTER}(t)$ can be the time of the master clock for the time step of the simulation just completed, wherein, in accordance with the equation, the respective delta times of the clocks can be compared to the current master clock, and the clock with the minimum delta time with respect to the current master clock (e.g., slowest clock that is furthest away in time from the time of the current master clock) can be the master clock for the next step of the simulation. The SMC 122 can dynamically select and set the master clock for the next simulation time step, and the counters of the respective n nodes can be corrected using PTP.

As an example of dynamic master clock selection, during a step of a controlled system simulation, clock 118 is selected as the master clock based at least in part on clock 118 running the slowest relative to the speed of the other clocks (e.g., clock 114, clock 116, clock 120) in system 100. The system 100 can execute to perform the simulation for the length of time of this step. Data can be exchanged in a synchronized manner between node 110 and node 112 and/or between components within node 110 or node 112, as more fully disclosed herein. The SMC 122 can evaluate the relative speeds of the clocks 114, 116, 118 and 120, can identify the clock that operated at the slowest speed relative to the other clocks over the last step, and can dynamically select the clock that operated at the slowest speed to be the master clock for the next step. Thus, if clock 120 operated at a slower speed than the current master clock, clock 118, and the other clocks (e.g., 114, 116) during the last step, the SMC 122 can dynamically switch the master clock from being clock 118 to clock 120 for the next step, in accordance with the predefined simulation criteria. The next step of the simulation can be performed with clock 120 acting as the master clock for that step.

With regard to the synchronization process that can be performed using system 100, the nodes, including node 110 and node 112, can have their respective clocks synchronized and data channels synchronized based at least in part on PTP at a first frequency, f1. Clock adjustments (e.g., detection of slowest clock) can be performed at a second frequency, f2, wherein f2 can be a greater frequency than f1 (e.g., f2 can be twice as great as f1). For instance, the first frequency, f1, can be employed to facilitate controlling the execution of the simulation of the controlled system, and the second frequency, f2, can be employed to facilitate detection of the slowest clock over a given time step in the controlled system simulation, as well as allow for the time desired to halt the simulation process, relocate the master clock when desired in accordance with the predefined simulation criteria, and restart the simulation process.

The disclosed subject matter, by dynamically selecting the master clock to be the current slowest clock for each step of a controlled system simulation, can dynamically correct the master clock to facilitate system convergence, as compared to conventional controlled system simulations employing current IEEE 1588 PTP standards. The disclosed subject matter can synchronize controlled systems with different running speed, as the disclosed subject matter is not limited by the speed of a fixed master clock. The disclosed subject matter can enable synchronization of the controlled system without a centrally controlling clock, and minimizes or eliminates the problem with simulations that run slower than a master clock. Also, the disclosed subject matter can employ two-level core frequencies to allow an observer's transactions to adjust the master clock at a faster frequency than current PTP frequency. Further, in accordance with the disclosed subject matter, the slave clocks can influence the location of a master clock at a given time to thereby provide for a dynamically floating master clock and re-synchronization, wherein a bottleneck node (e.g., a node and associated clock that is running slower than the other nodes and respectively associated clocks) can be dynamically identified. Thus, by altering the master clock behavior, via dynamic selecting/switching of master clocks, the disclosed subject matter can enable the overall system to desirably (e.g., smoothly) transit into the bottleneck location.

The disclosed subject matter can perform distributed synchronization respecting hardware and/or software limitations of respective controlled system components, wherein at least a portion of the limitations can be eliminated. The disclosed subject matter can thereby provide a modified IEEE 1588 PTP standard that dynamically selects master clocks based at least in part on the relative slowness of clocks with respect to each other at various points (e.g., steps) of the controlled system simulation, and, as a result, the disclosed subject matter can ensure that all nodes (e.g., 110, 112) in the synchronization system are able to run as fast as the clock that is the master clock at a particular time in the simulation. In accordance with the disclosed subject matter, there also is no requirement that there be feedback from the partial nodes clocks to the current master clock.

In an aspect, during the simulation of the controlled system, at desired times, such as at the end of a step, intra-node and/or inter-node data exchanges can be desired, depending at least in part on the design of the simulated controlled system, the processes or functions performed during the step, a prior step(s), or the processes or functions to be performed in the next step, and/or other factors. At desired times, the node 110 and node 112 can respectively perform synchronized intra-node data exchanges, wherein, for example, the controller (e.g., 102, 104) can exchange information with an associated simulation component (e.g., 106, 108) or another component within the respective node. At desired times, the node 110 and node 112 can exchange data between each other. The communication between node 110 and node 112 can be facilitated by communicating the data via a desired transmission protocol. For example, Transmission Control Protocol (TCP) protocol wrapped in Open Source ActiveMQ technology can be employed as the transmission protocol, although a smaller head packet transmission protocol can be desirable.

Figure 5:
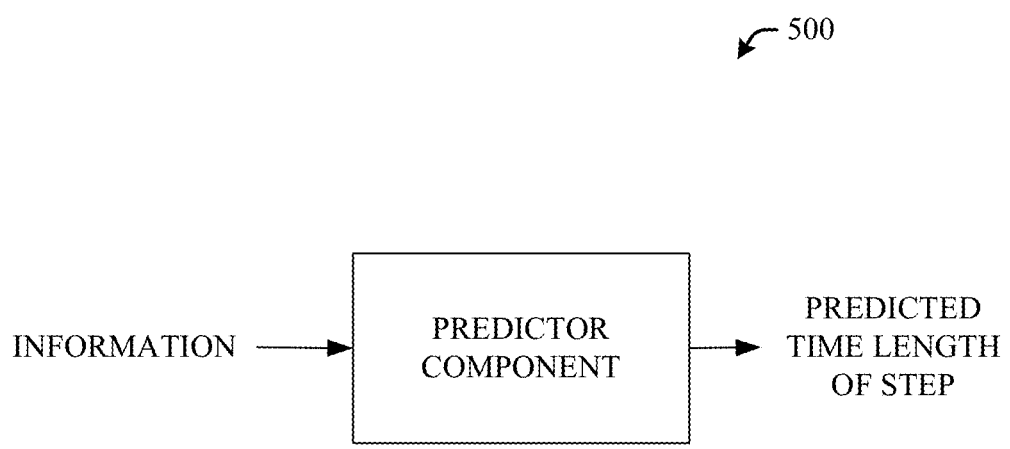
FIG. 5 illustrates a block diagram of an example predictor component in accordance with various aspects and embodiments of the disclosed subject matter.

In still another aspect, the SMC 122 also can predict the length of time the next step of the simulation is to be based at least in part on the predefined simulation criteria. Conventionally, when preparing to execute the next step of a simulation, one time slice of a specified length is added to the master clock (e.g., controller's clock). However, the clock does not always advance precisely one time slice at a time, because the clock is aperiodic. This means that such clock does not follow an incremental periodic pattern, as the period can sometimes be larger or sometimes be smaller than the desired time slice at each update rate pulse. As a result, when the next simulation time is estimated for the next step, the simulation clock typically ends up outside the controller's time slice range since, conventionally, a fixed time slice is used in the calculation. In an aspect, the SMC 122 can predict the length of time of the next simulation step, for example, based at least in part on the historical performance of the controller and/or other information relating to time slice determinations (e.g., prior time lengths associated with controllers). For instance, in accordance with various embodiments, the SMC 122 can comprise a predictor component (e.g., adaptive predictor) (not shown in FIG. 1; as depicted in FIG. 5) that can comprise a desired filter (e.g., adaptive filter), such as a Kalman filter, filter employing fuzzy logic, LaGrange interpolation filter, Kernel adaptive filter, least-means-squares filter, recursive-least-squares filter, etc. The SMC 122 can identify and set the length of time of the next step of a controlled system simulation in accordance with the predicted length of time for simulation of the next step (e.g., the length of time can be set as the predicted length of time or as a function of the predicted length of time).

It is to be appreciated and understood that, while the subject specification is often described herein with regard to a distributed controlled system simulation architecture, the subject specification is not so limited, as the disclosed subject matter can be applied to other fields, including, for example, data streaming, online gaming, conferencing, controls, etc.

Figure 2:
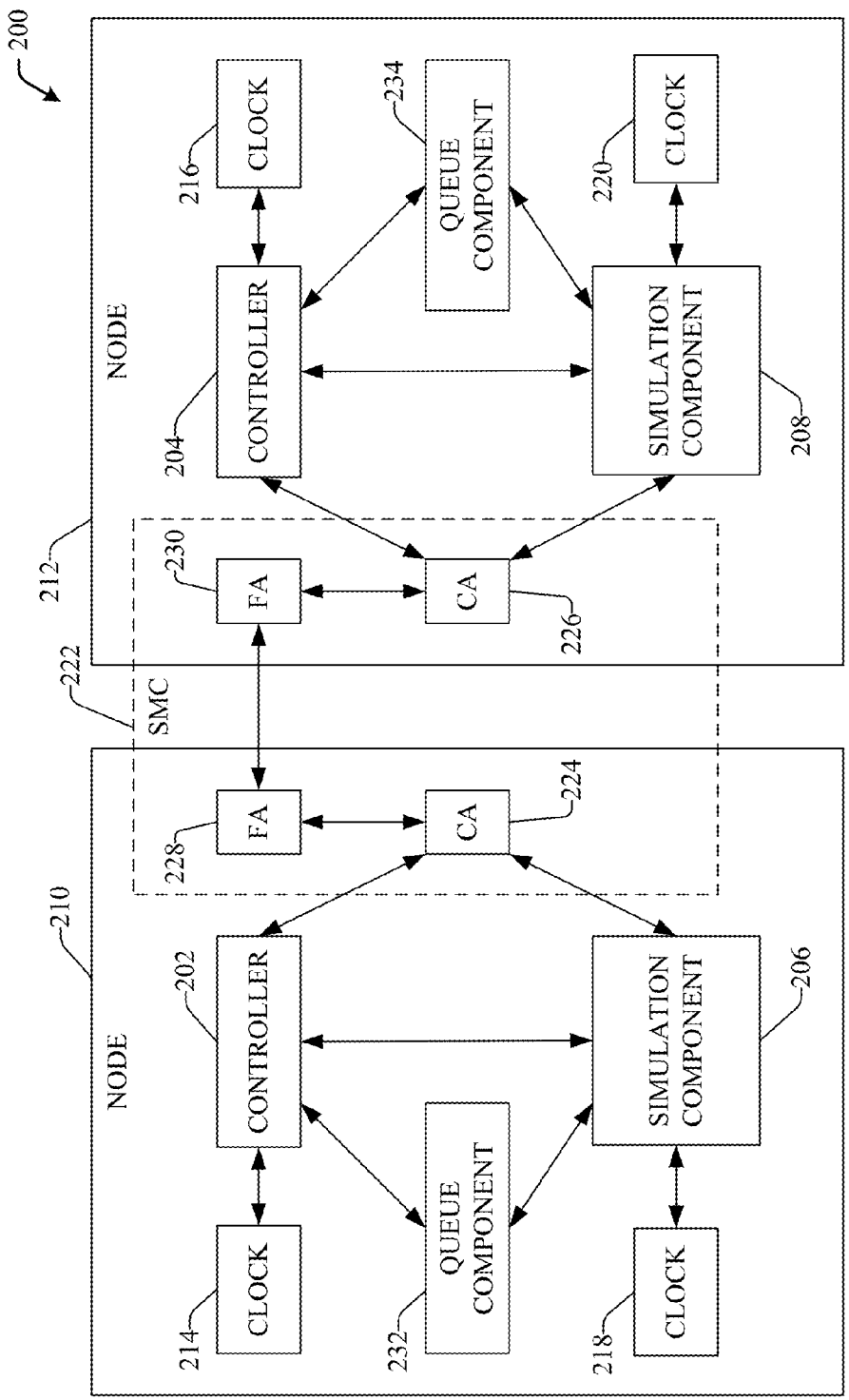
FIG. 2 illustrates another block diagram of an example system that can facilitate management of controlled system simulation in accordance with various aspects and embodiments of the disclosed subject matter.

Turning to FIG. 2, illustrated is a block diagram of an example system 200 that can facilitate management of controlled system simulation in accordance with various aspects and embodiments of the disclosed subject matter. The system 200 can include a desired number of controllers, such as controller 202 and controller 204, a desired number of simulation components, such as simulation component 206 and simulation component 208, wherein the controllers and simulation components can be part of respective nodes, such as node 210 and node 212, and wherein respective controllers can be associated with respective simulation components. The system 200 also comprises a desired number of clocks, such as clock 214, clock 216, clock 218 and clock 220, which can be respectively associated with the controllers and simulation components in the system 200. The system 200 also can contain an SMC 222 that can be associated with the nodes, including the controllers and simulations components that are respectively part of the nodes, to facilitate controlling the controlled system simulation. In an aspect, the SMC 222 can be de-centralized, and thus, portions of the SMC 222 can be part of each node, including node 210, 212. It is noted that, in FIG. 2, the SMC 222 is depicted as a dotted line to emphasize that the SMC 222 can be de-centralized. The respective components of the system 200 each can comprise the same or similar functionality as respective components (e.g., respectively named components), as described herein.

In an aspect, the system 200 can comprise a multi-stage (e.g., three stage) distributed simulation and control synchronization agent architecture, wherein the synchronization agent architecture can include a workstation cluster and a domain cluster. A workstation cluster can comprise at least four components, including, one or more controllers, one or more simulation components, a coordinator agent (CA), and a federated agent (FA). For instance, there can be N number of controllers and M number of simulation components, wherein N and M can be respective integer numbers that can be the same as or different from each other. A controller (e.g., 202) can be, for example, a soft controller (e.g., soft PLC) where a desired control algorithm(s) can be executed and synchronized with process level simulations, wherein an associated simulation component(s) (e.g., 206) can represent a process simulation. A controller (e.g., 202, 204) can comprise a wrapper with a synchronization access interface, and a simulation component (e.g., 206, 208) can comprise a wrapper with a synchronization access interface.

In another aspect, each node, including node 210 and node 212, can comprise a CA, such as CA 224 in node 210 and CA 226 in node 212, and a FA, such as FA 228 in node 210 and FA 230 in node 212, wherein the CAs (e.g., 224, 226) and FAs (e.g., 228, 230) also can be part of the SMC 222, which can be de-centralized so that these portions of the SMC 222 can reside within the nodes (e.g., 210, 212). In an embodiment, CA 224, CA 226, FA 228, and FA 230 can be part of the SMC 222, although it is to be appreciated and understood that, as desired, in accordance with various other embodiments, a CA or FA can be a stand-alone component or part of still another component. In system 200, controller 202, simulation component 206, CA 224, and FA 228 can be part of a first workstation cluster, and controller 204, simulation component 208, CA 226, and FA 230 can be part of a second workstation cluster.

A CA, such as CA 224 and CA 226, can perform desired functions to facilitate controlling operation and simulation of a controlled system (e.g., plant or process desired to be controlled). A CA (e.g., 224, 226) can facilitate synchronization of data exchanges among an associated controller (e.g., 202, 204) and associated simulation component (e.g., 206, 208). The data exchange synchronization can occur in a bi-directional manner in a multi-queue system, as more fully disclosed herein.

The CA (e.g., 224) can create a shared memory registry for associated controllers (e.g., 202) and simulation components (e.g., 206). Each controller (e.g., 202, 204) and simulation component (e.g., 206, 208) can connect to a respective CA (e.g., 224, 226) using desired agent registration protocols, wherein the connections can be supported by multi-shared memory maps that can be maintained by the respective CAs in a central location as workstation scoped connections, which, for example, can facilitate communication between components, such as intra-node communication between a controller and associated simulation component. When a controller (e.g., 202) or a simulation component (e.g., 206) registers with the CA (e.g., 224), the controller or simulation component can provide information, such as registration information to the CA, wherein the information can convey the identity of the respective component, physical location of the respective component, tag mapping, and/or other information. In an aspect, the data tag mapping can include tags that can represent input or output signals. Further, as part of the data tag mapping, data transmissions can be respectively time stamped with respective relevant times to facilitate data exchange synchronization.

The data tag mapping can facilitate synchronous intra-node data exchanges and inter-node data exchanges. In an aspect, the shared memory registry can be a multi-section (e.g., two-section) data block that can convey process and clock data. The CA (e.g., 224) can use the shared memory registry to facilitate establishing the workstation-scoped connections among the associated components (e.g., controller and associated simulation component). In another aspect, the CA (e.g., 224) can coordinate a data exchange between components by signaling a ready bit in the clock section to indicate that the data exchange is to occur. In an aspect, the nodes (e.g., 210, 212) can exchange data with each other throughout the shared memory maps.

In another aspect, a CA (e.g., 224, 226) can control progression of the runtime execution of its associated controller(s) (e.g., 202, 204) and simulation component(s) (e.g., 206, 208) based at least in part on a synchronized precision clock algorithm. A CA (e.g., 224, 226) can coordinate adjustment of the precision clock state with its associated FA (e.g., 228, 230) in a periodic manner. The main coordination between a CA (e.g., 224, 226) and FA (e.g., 228, 230) can occur in a top down manner that can be triggered by the FA (e.g., 228, 230) upon completing a synchronization cycle. In an aspect, the CA (e.g., 224, 226) can emit events into the associated FA (e.g., 228, 230) to present local pulse deviations to the FA, for example, when a clock associated with a component associated with a CA is detected by the CA as being relatively slower than other clocks. A CA also can utilize registration data of the associated controller(s) (e.g., 202, 204) and associated simulation component(s) (e.g., 206, 208) to generate tag mapping to associate the respective controllers and simulation components that are to be exchanging data with each other.

In another aspect, for each node (e.g., 210, 212), the respective CAs (e.g., 224, 226) can facilitate intra-node data exchanges. During controlled system simulation, depending at least in part on controlled system design, during execution of a particular portion of the controlled system simulation, it can be desired for the controller (e.g., 202) to exchange information with the simulation component (e.g., 206) or vice versa. The CA (e.g., 224) can facilitate coordinating the data exchange between the controller (e.g., 202) and simulation component (e.g., 206) without having to involve the FA (e.g., 228). The intra-node data exchanges can be bi-directional, and data can be read from or written to the shared memory as input blocks and output blocks. The order of individual tags within data blocks can be defined at configuration time, for example.

Figure 3:
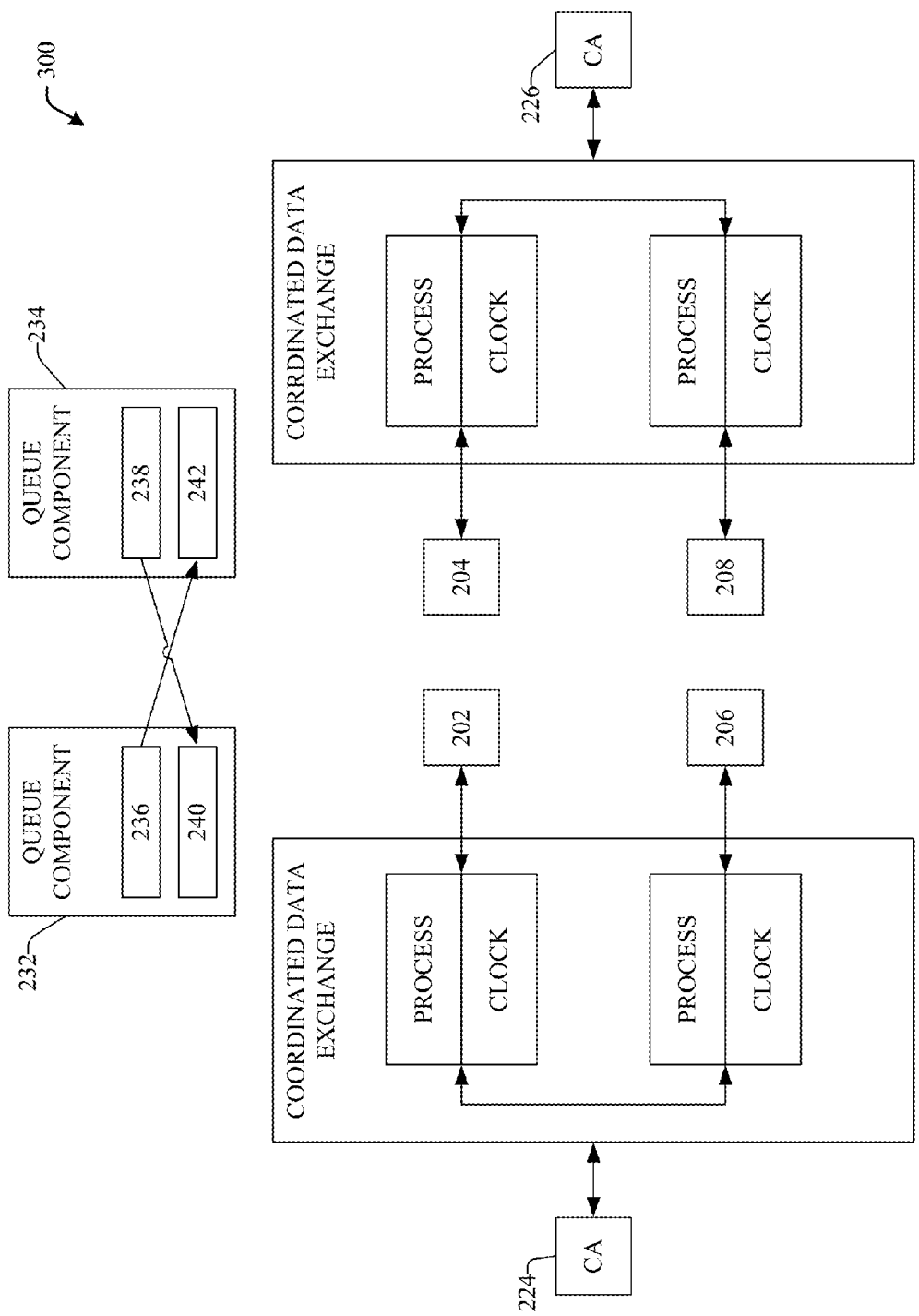
FIG. 3 illustrates a diagram of an example system that can facilitate synchronized data exchanges between nodes in accordance with various aspects of the disclosed subject matter.

With regard to inter-node data exchanges, there can be coordinated and synchronized data exchanges between nodes (e.g., 210, 212) at desired times (e.g., at the end of a simulation step). Referring briefly to FIG. 3 (along with FIG. 2), depicted in FIG. 3 is a diagram of an example system 300 that can facilitate synchronized data exchanges between nodes (e.g., 210, 212) in accordance with various aspects of the disclosed subject matter. In an aspect, there can be directed tag registration propagation to a desired node (e.g., 210, 212). Each node (e.g., 210, 212) can include respective queue components, such as queue component 232 and queue component 234, that can include a desired number of queues to facilitate synchronized data exchanges. For instance, a queue component (e.g., 232, 234) can comprise a producer queue (e.g., 236, 238) (e.g., inter-node producer queue) to hold (e.g., store) data that is to be provided to another component (e.g., another node), and a consumer queue (e.g., 240, 242) (e.g., inter-node consumer queue) that can be available to receive data from another component (e.g., another node). To facilitate synchronization of the data exchanges between the nodes (e.g., 210, 212), the data packets being exchanged can be time stamped, or otherwise be associated with a time element, indicating the period of time (e.g., specified moment in time, specified time period extending longer than a moment) in the simulation with which the information in the data packet relates. The time-associated (e.g., time-stamped) data packets can be communicated from a queue component (e.g., a producer queue, such as producer queue 236, in the queue component 232) of one node to the queue component (e.g., a consumer queue (e.g., 242) in another queue component 234) of another node. The respective queue components 232, 234 can re-arrange the order of the data packets in their respective queues (e.g., consumer queues 240, 242), based at least in part on the respective times associated with the respective data packets, which can facilitate synchronization of the inter-node data exchange. For example, the data packets can be arranged with the oldest data packet being first in the consumer queue (e.g., 240) followed by the next oldest data packet, and so on, with the last data packet in the queue being the newest data packet (e.g., data packet associated with the most recent time). Thus, the data packets can be time-based ordered in the respective queues (e.g., consumer queues 240, 242) in accordance with the respective times associated with the respective data packets. Since all of the nodes (e.g., 210, 212) can maintain synchronization of the respective clocks, the time-based sorting of data packets in the respective queues (e.g., consumer queues 240, 242) can ensure organized and synchronized data consumption by the receiving node.

With regard to FIG. 2, in still another aspect, an FA (e.g., 228, 230) can coordinate its activities in two levels: on an inter-FA level (e.g., between FA 228 and FA 230), and on an FA-CA level (e.g., between FA 228 and CA 224). An FA (e.g., Federated Precision Time Coordinator) can act as a global clock manager for the clocks associated with the workstation cluster to which the FA belongs. The inter FA activity can comprise a number of stages, wherein FA registration into a domain cluster can be facilitated using a desired agent registration protocol, tag maps can be disseminated by one FA to another FA, precision clock synchronization, and coordination with an associated CA.

In an aspect, the respective FAs (e.g., 228, 230) can detect or discover other FAs that are part of the simulated controlled system, and the FAs can associate with each other to form a virtual coordination cluster (also referred to as a domain cluster), wherein the FAs can interact with each other via messages and signals communicated between the FAs (e.g., 228, 230) to facilitate clock synchronization, synchronous data exchanges, and performance of other management aspects of the controlled system simulation.

In another aspect, an FA (e.g., 228) can collaborate with other FAs (e.g., peer FAs) in the domain cluster to identify or calculate time progression errors with regard to the controlled system simulation. The time progression errors can be calculated on a per workstation basis, and the time progression errors can serve as the basis for adjusting a master clock entity, such as a pseudo IEEE 1588 master clock entity, wherein the master clock of the simulated controlled system can be dynamically selected at various points of the simulation, as described herein. The pseudo master clock entity can track all workstation clocks to calculate a system apparent synchronized clock. In each synchronization cycle, an FA (e.g., 228, 230) can coordinate adjustment of the workstation cluster's clock. The CA (e.g., 224, 226) can utilize the adjusted time to facilitate coordination of the runtime execution of the simulation of the respective nodes (e.g., 210, 212). In an aspect, the calculation of the system apparent clock and localized clock synchronization can occur in its context, and it does not interfere with the data exchange process, which can occur concurrently with the clock synchronization.

In another aspect, if a CA (e.g., 224, 226) detects a slower clock, the CA can emit a relocation event into the federated level, to its associated FA (e.g., 228, 230), to facilitate adjusting the pseudo master clock. For example, the relocation even can be emitted to the FA when the CA detects a relative slowing down tendency of any of the workstation level clocks (e.g., clock 214 or clock 218 for the first workstation cluster, or clock 216 or clock 220 for the second workstation cluster). Data exchange synchronization can be reorganized so that it can coincide with virtually any clocking variation.

In an aspect, to facilitate clock synchronization for the controlled system simulation, the SMC 222 can employ a two-phase algorithm. In the first phase, which can be performed at the CA level, during each step of the simulation, the CA (e.g., 224, 226) can:

(1) the CA can signal all components in the associated node to advance to the next step of the simulation and stop;
(2) the CA can detect the slowest component in the node (e.g., detect the slowest component or associated clock in the node),
  (2.1) if the CA detects that there is a component that is running at a slower rate than the other components in the node,
  (2.11) the CA can generate and send a relocation clock exception message to the associated FA,
  (2.12) the FA (e.g., 228, 230) can propagate the relocation clock exception message to the other FAs,
  (2.13) the CA can wait to receive a continue signal from the FA, wherein the continue signal can indicate that the CA can continue the simulation process,
  (2.14) if the continue signal is received by the CA from the FA, the CA can update and continue, but while no continue signal is received by the CA, the CA can wait;
(3) the CA can calculate the next time step and delay (e.g., offset) for the faster (e.g., fastest) components, of the simulation;
(4) the CA can update the node's apparent clock;
(5) the CA can send a multicast message to the (n–1) components in the workstation cluster to advance to the next step of the simulation;
(6) the CA can enable data exchange, wherein data obtained from a remote location (e.g., another node) can be accessed and consumed from the time-ordered queues (e.g., consumer queue). The CA can proceed back to (1) wherein the CA can signal all associated components to advance to the next simulation step and stop.

In the second phase, which can occur at the FA level, during each step of the simulation, (1) the SMC 222 can perform the controlled system simulation by performing the simulating in accordance with nominal 1588 PTP standards acting as if all clocks in the controlled system simulation are stable (e.g., operating at a uniform speed);
(2) the FA (e.g., 228, 230) can adjust the apparent clocks associated with its node;
(3) if there is an apparent clock exception, wherein an apparent clock exception can be identified in a relocation clock exception message received from a CA,
  (3.1) the FAs can each stall their respective clock,
  (3.2) the SMC 222 can relocate the master clock (e.g., in accordance with the modified IEEE 1588 PTP), wherein the SMC 222 can identify the clock that is to serve as the new master clock and can select that clock as the master clock for at least the next simulation step (e.g., synchronization step), wherein the new master clock can be the clock that is operating at the slowest rate relative to the other clocks associated with the controlled system simulation,
  (3.3) the SMC 222, via the FAs, can identify and adjust the respective PTP offsets for the respective clocks with respect to the master clock,
  (3.4) the SMC 222, via the respective FAs, can send a continue signal to the respective nodes to continue the controlled system simulation.

If there is no apparent clock exception, the SMC 222 can perform the controlled system simulation by performing the simulating in accordance with nominal 1588 PTP standards acting as if all clocks in the controlled system simulation are stable until an apparent clock exception occurs.

Figure 4:
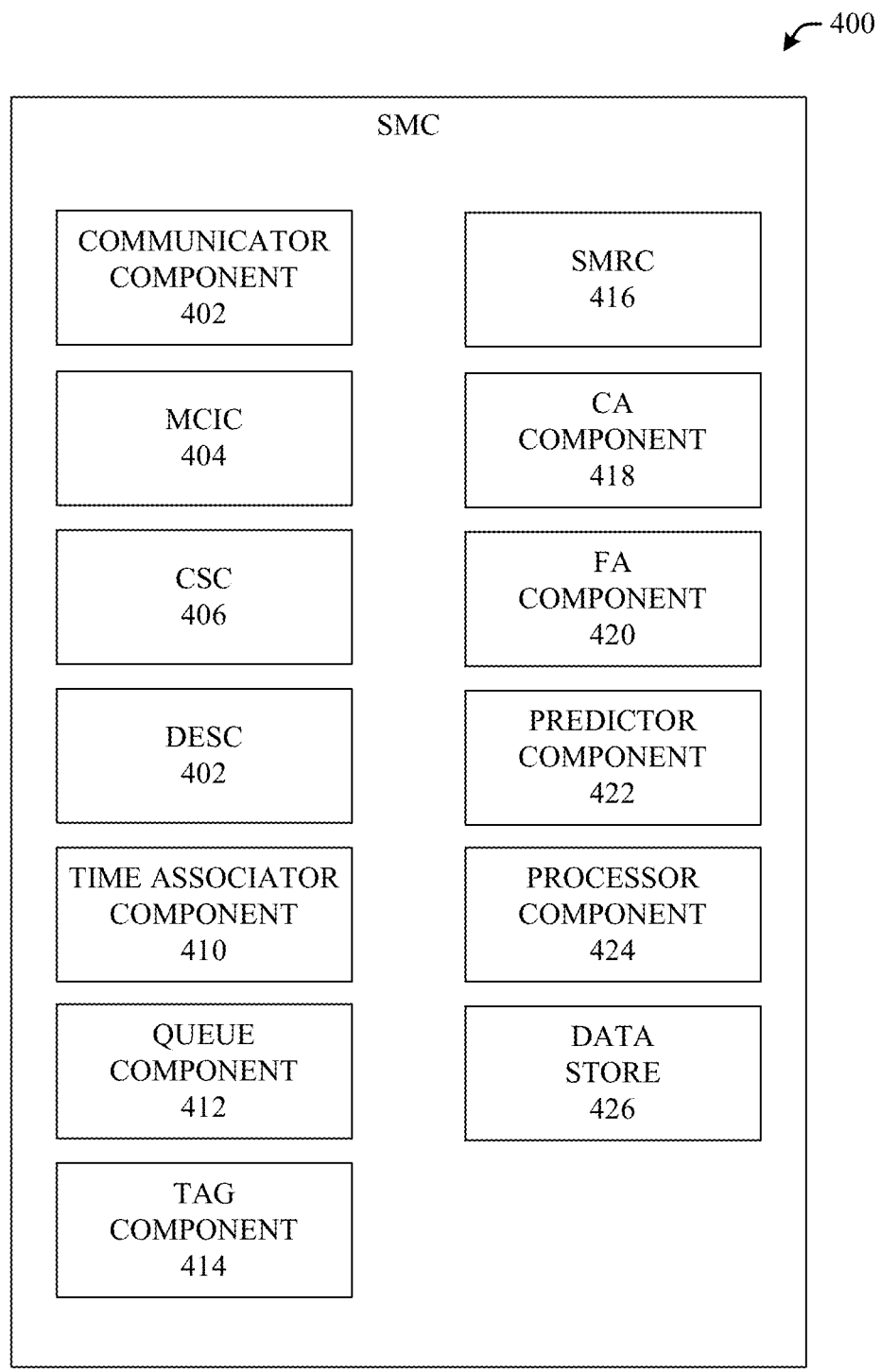
FIG. 4 illustrates a block diagram of a block diagram of an example simulation management component (SMC) in accordance with various aspects of the disclosed subject matter.

FIG. 4 illustrates a block diagram of an example SMC 400 in accordance with various aspects of the disclosed subject matter. In an aspect, the SMC 400 can comprise a communicator component 402 that can facilitate communication of information between various components within the SMC 400 and components (e.g., node, controller, simulation component, etc.) associated with (e.g., connected to) the SMC 400. The communicator component 402 can facilitate communications in accordance with one or more desired communication protocols.

The SMC 400 also can include a master clock identifier component (MCIC) 404 that can monitor information relating to the respective clock speeds of respective clocks associated with respective controllers and simulation components. At desired times (e.g., at the end of a simulation step), the MCIC 404 can identify the clock that is operating at the slowest speed relative to other clocks associated with the controlled simulation system. The MCIC 404 can select the clock, which is operating at the slowest speed relative to other clocks, to be the master clock for the next simulation step, in accordance with the predefined simulation criteria.

In another aspect, the SMC 400 can contain a clock synchronization component (CSC) 406 that can facilitate synchronizing the clocks associated with the controlled system simulation. The CSC 406 can employ one or more clock synchronization engines that can provide synchronization pulses to controllers and simulation components to facilitate executing the simulation. The CSC 406 can facilitate identifying or calculating respective PTP offsets for respective clocks in relation to a current master clock, to facilitate synchronization of clocks with each other during respective steps of the controlled system simulation.

The SMC 400 can comprise a data exchange synchronization component (DESC) 408 that can facilitate synchronized exchange of data between components (e.g., nodes or components therein) and other components (e.g., other nodes or components therein) at desired times. In an aspect, the SMC 400 can include a time associator component 410 that can associate a specified time or period of time with a piece of data, such as a data packet, to facilitate data exchange synchronization. For instance, for all or a desired portion of data packets, the time associator component 410 can associate a time stamp or insert a time stamp with a data packet. In still another aspect, the SMC 400 can include a queue component(s) 412 that can comprise a desired number of queues, such as producer queues and consumer queues, respectively associated with each node. The queue component 412 can re-arrange received data in order of time based at least in part on the respective times (e.g., time stamps) associated with the respective data packets in the queue. The queue component, or at least a desired part of the queue component, can be part of the data store 426. The DESC 408 can operate in conjunction with the queue component 412 and time associator component 410 to facilitate synchronization of the exchange of the data packets for use by the receiving component that consumes (e.g., uses) the data.

The SMC 400 also can include a tag component 414 that can facilitate creating data tags and data tag mapping. The data tag mapping can be used to facilitate data exchange synchronization, for example, between nodes. In yet another aspect, the SMC 400 can comprise a shared memory registry component (SMRC) 416 that can comprise store and provide (e.g., convey) process and clock data respectively associated with respective components in the simulated controlled system. The information in the SMRC 416 can be employed to facilitate creating workstation-scoped connections among the components. The SMRC 416, or at least a desired part of it, can be part of the data store 426.

In still another aspect, the SMC 400 can contain a CA component 418 that can comprise a desired number of CAs that can be distributed so that there is a CA for each node. The CA component 418 can facilitate clock synchronization and data exchange synchronization as described herein. The SMC 400 also can include an FA component 420 that can comprise a desired number of FAs that can be distributed so that there is an FA for each node. The FA component 420 can operate in conjunction with the CA component 418 to facilitate clock synchronization and data exchange synchronization as described herein. The FA component 420 also can enable inter-FA communication of information (e.g., tag mapping, propagation of clock exception messages, etc.). It is to be appreciated and understood that, while certain components are depicted as residing outside of the CA component 418 and FA component 420, in accordance with various embodiments, one or more components of the SMC 400 can reside within the CA component 418 or FA component 420.

In yet another aspect, the SMC 400 can employ a predictor component 422 that can predict a desired length of time for a next step of a controlled system simulation. In accordance with various embodiments, the predictor component 422 can comprise an adaptive predictor, which can be based at least in part on an adaptive filter (e.g., a Kalman filter), to accurately predict the length of time for the next simulation step. The predictor component 422 can operate in conjunction with the CSC 406 to facilitate clock synchronization of the clocks associated with the controlled system simulation.

In an aspect, the SMC 400 can comprise a processor component 424 that can work in conjunction with the other components (e.g., communicator component 402, MCIC 404, CSC 406, DESC 408, time associator component 410, queue component 412, tag component 414, shared memory registry component 416, CA component 418, FA component 420, predictor component 422, etc.) to facilitate performing the various functions of the SMC 400. The processor component 424 can employ one or more processors, microprocessors, or controllers that can process data, such as information relating to clock synchronization, information relating to data exchange synchronization, information relating to prediction of a length of time for a simulation step, information relating to other operations of the SMC 400, and/or other information, etc., to facilitate operation of the SMC 400, as more fully disclosed herein, and control data flow between the SMC 400 and other components (e.g., nodes, controllers, simulation components, HMI, etc.) associated with the SMC 400.

The SMC 400 also can include a data store 426 that can store data structures (e.g., data, metadata), code structure(s) (e.g., modules, objects, hashes, classes, procedures) or instructions, information relating to clock synchronization, information relating to data exchange synchronization, information relating to prediction of a length of time for a simulation step, information relating to other operations of the SMC 400, synchronization algorithms, tag-related information, historical information relating to the controlled system simulation, and/or other information, information relating to other operations of the SMC 400, etc., to facilitate controlling operations associated with the SMC 400. In an aspect, the processor component 424 can be functionally coupled (e.g., through a memory bus) to the data store 426 in order to store and retrieve information desired to operate and/or confer functionality, at least in part, to the communicator component 402, MCIC 404, CSC 406, DESC 408, time associator component 410, queue component 412, tag component 414, shared memory registry component 416, CA component 418, FA component 420, predictor component 422, and/or substantially any other operational aspects of the SMC 400.

Referring to FIG. 5, illustrated is a block diagram of an example predictor component 500 in accordance with various aspects and embodiments of the disclosed subject matter. In accordance with various embodiments, the predictor component 500 can be an adaptive predictor that comprises an adaptive filter, such as, for example, a Kalman filter, filter employing fuzzy logic, LaGrange interpolation filter, Kernel adaptive filter, least-means-squares filter, recursive-least-squares filter, etc., to facilitate determining a length of time for a next step of a controlled system simulation.

Typically, during a controlled system simulation, a synchronization engine, which can be associated with a CA, can provide synchronization pulses from the CA to a controller(s) and simulation component(s) in a node to advance the time of the respective components. The synchronization pulses can be transmitted via shared memory channels (e.g., shared memory pipes) to reduce communication overheads that are introduced by Transmission Control Protocol (TCP) or Object Linking and Embedding (OLE) for Process Control (OPC) communication. Even though the shared memory channels can provide a very effective communication pathway, the performed of the controller (e.g., controller emulator) can be highly influenced by the host machine's central processing unit (CPU) cycles and control routing scanning cycles. When the synchronization pulse arrives to the controller's clock observer to suspend the progression of the clock associated with the controller, the clock may already have advanced more or less than the desired time slice that was set for the system for that portion (e.g., step) of the controlled system simulation.

It can be desirable (e.g., required) to maintain strict time tolerances with regard to simulation time to facilitate fast speed application, wherein the maximum allowable time tolerance can be in the order of approximately +/−3 milliseconds. Typically, time offset between a controller and a simulation component is not to exceed the maximum allowable time tolerance. The predictor component 500 can employ a time-slice technique that can improve accuracy of the clock synchronization engine.

Figure 6:
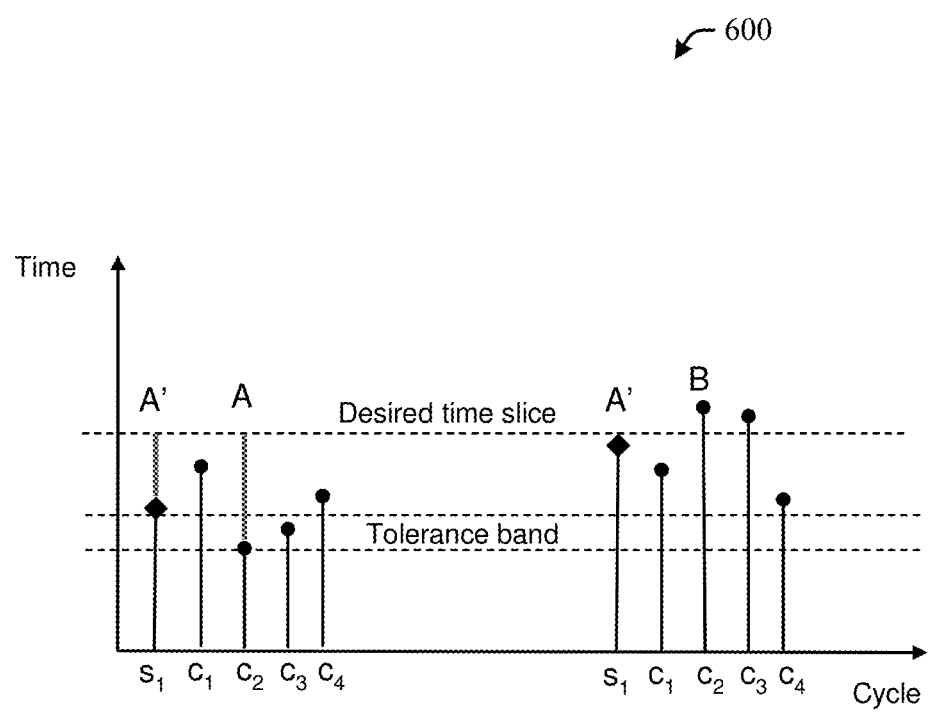
FIG. 6 depicts a diagram of an example graph of an aperiodic time slide in relation to a controller.

Referring briefly to FIG. 6 (along with FIG. 5), illustrated is a diagram of an example graph 600 of an aperiodic time slide in relation to a controller, in accordance with an aspect. A desired clock synchronization algorithm can be employed to follow the slowest controller in a pool of controllers, such as controllers C1, C2, C3, and C4 in graph 600, in a simulated controlled system to determine the next time slice for the simulation (S1). In this example graph 600, the slowest controller is C2. To advance the simulation, a fixed time slice amount can be added to the actual clock time of the controller C2, yielding a new time stop for the simulation at point $A=T_{slowest}+$Time Slice, wherein $T_{slowest}$ can be the time of the slowest clock associated with the slowest controller C2. Since the simulation engine of the SMC can be very precise in achieving a target time step, the simulation typically will complete its cycle at clock time A'. However, since the clock of the controller is aperiodic, the controller will complete its cycle at time B. In each synchronization cycle, only those controllers that fall within a predefined tolerance band are set to advance to the next step. All other controllers that fall outside the predefined tolerance band can wait.

In the next synchronization cycle, the controller C2 may or may not be the next slowest controller. The desired clock synchronization algorithm can be employed to identify the slowest controller and associated clock to set the tolerance band and determine the next time slice for the controlled system simulation. As shown in graph 600, there can be a problem with typical general case synchronization engines that do not use the IEEE 1588 model. In the simulation synchronization domain, it is virtually impossible to use the conventional IEEE 1588 model since the simulation clock and controller clocks are periodic.

The modified IEEE 1588 standard disclosed herein can facilitate clock synchronization. Further, the predictor component 500 can be employed to accurately predict the desired time slice for the next step of a controlled system simulation.

In one embodiment, the predictor component 500 can utilize a Kalman filter to facilitate predicting the length of time to be employed for a next simulation step. A Kalman filter is a technique that uses measurements that are observed over time by the predictor component 500, wherein the measurements can contain noise (e.g., random variations) and other inaccuracies, and using the Kalman filter, the predictor component 500 can produce values (e.g., length of time for a simulation step) that typically are closer to the true values of the measurements and their associated calculated values. The Kalman filter can produce estimates of the true values of measurements (e.g., time slice) and their associated calculated values by predicting a value, estimating the uncertainty of the predicted value, and computing the weighted average of the predicted value and the measured value. For instance, the most weight can be given to the value with the least uncertainty. The estimates produced by the Kalman filter typically are closer to the true values than the original measurements because the weighted average has a better estimated uncertainty than either of the values that were used to compute the weighted average.

Figure 7:
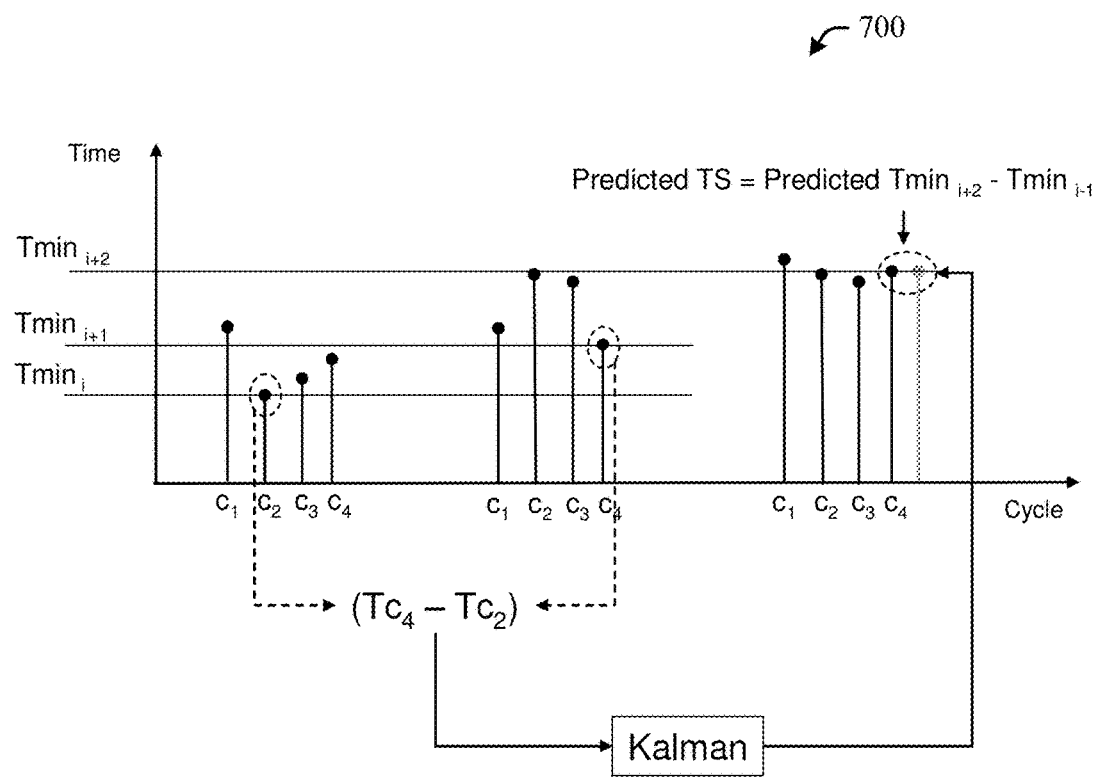
FIG. 7 illustrates a diagram of an example graph that shows the effect of the use of a Kalman filter in the calculation of the next cycle time slice (e.g., next step) for a controlled system simulation, in accordance with an aspect.

Referring to FIG. 7 (along with FIG. 5), illustrated is a diagram of an example graph 700 that shows the effect of the use of a Kalman filter in the calculation of the next cycle time slice (e.g., next step) for a controlled system simulation, in accordance with an aspect. The graph 700 depicts example clock times over a number of cycles for clocks associated with respective controllers C1, C2, C3, and C4. In one aspect, the predictor component 500 can receive and evaluate current and/or historical information relating to time slices for the controlled system simulation. The predictor component 500, employing the Kalman filter, can learn and predict the behavior of the time slice for each synchronization cycle. As shown in the graph 700, the controllers C2 and C4 can convey the slowest clock in the first two respective clock cycles (e.g., C2 is associated with the slowest clock in the first cycle, and C4 is associated with the slowest clock in the second cycle). The Kalman filter can assume that the difference between these clock values of C2 and C4 to be the estimated time slice, which may or may not correspond to the actual value. The variability in the time slice can be influenced by the CPU cycles and the control and simulation model characteristics, for example. A larger combination of calculations and/or routines can make a model more complex and therefore demand more CPU dedication to it.

In an aspect, the estimated time slice can be provided to the Kalman filter in the predictor component 500 to predict the next time slice. The predicted time slice can be provided to the simulation engine to advance to the next step. Progressively, the Kalman filter can learn the pattern of the machine (e.g., computer) that is running the simulation, and the predicted time slice can become more representative of the desired time slicing requirement, wherein the Kalman filter can function adaptively to produce more accurate predictions of time slices over time. For instance, as shown in graph 700, the Kalman filter can produce a predicted time slice as Predicted $TS=$Predicted $Tmin_{i+2}-Tmin_{i-1}$, wherein Predicted TS is the predicted time slice for the next step, Predicted $Tmin_{i+2}$ is the predicted time slice for $Tmin_{i+2}$, and $Tmin_{i-1}$ is the time slice for the i−1 cycle.

Figure 8:
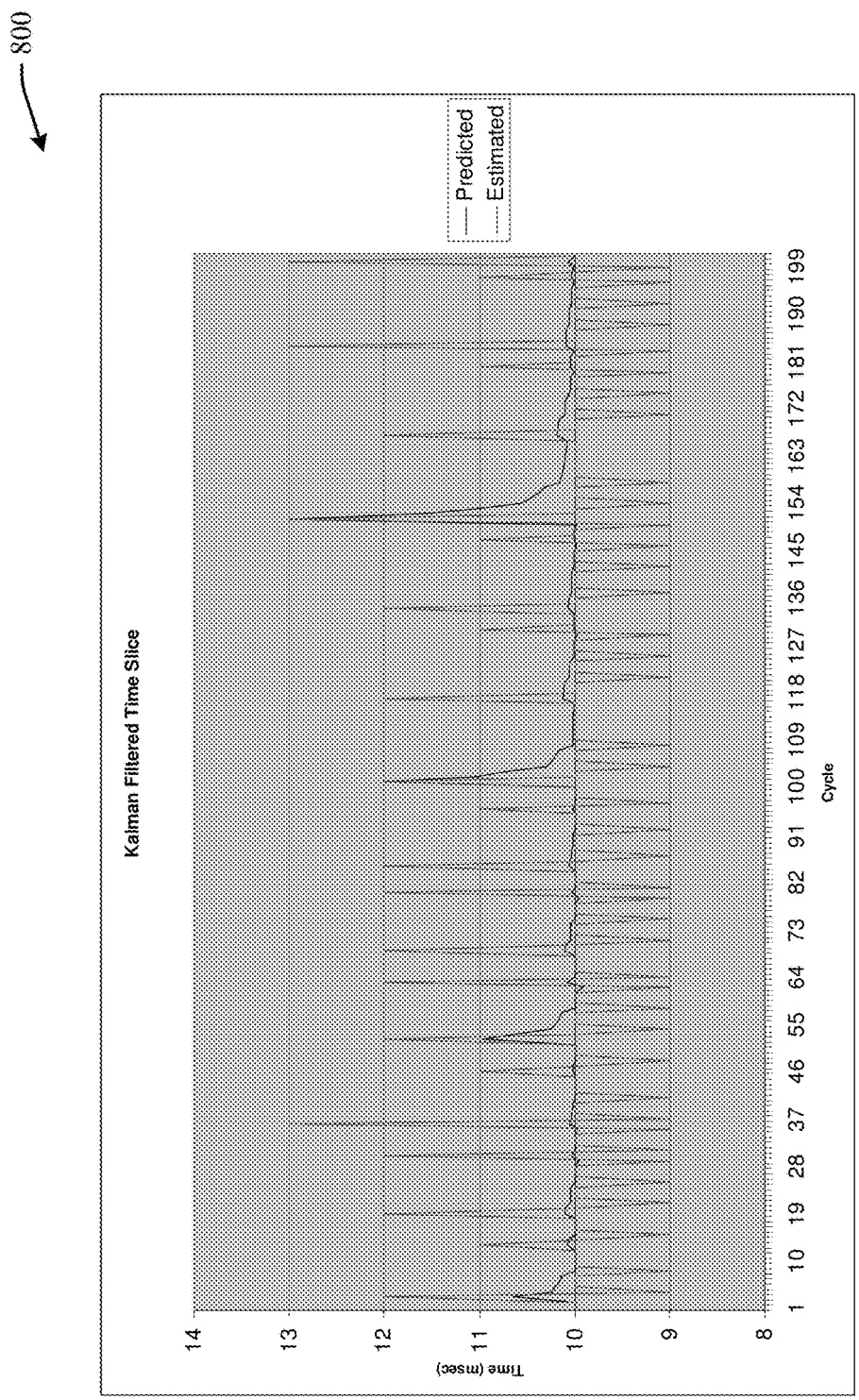
FIG. 8 depicts a diagram of an example graph that shows a partial result of the application of the Kalman filter to a simulation system composed of one Matlab simulation and two RSEmulate controllers.

Referring briefly to FIG. 8 (along with FIG. 5), depicted is a diagram of an example graph 800 that shows a partial result of the application of the Kalman filter to a simulation system composed of one Matlab simulation and two RSEmulate controllers. The graph 800 shows the estimated and predicted time slices for a system slicing at 10 ms. The predicted time slice is the result of the combined effect of the historical time slice and not the instantaneous time slice. The Kalman filter can analyze, for example, certain primary trends for the predicted time slice to be used to advance the simulation, wherein the trends can include a collection of time-slice points that match the desired 10 ms time slice, a collection of time-slice points that overshot the desired time slice, and a collection of time-slice points that undershot the desired time slice.

Figure 9:
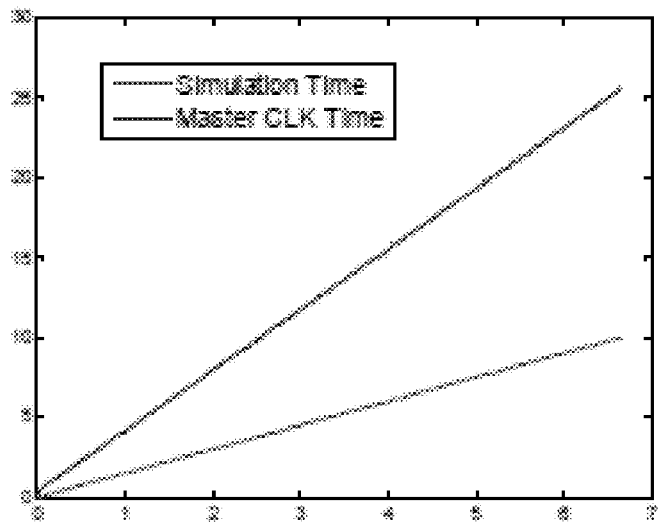
FIG. 9 illustrates a diagram of an example graph that compares simulation time and master clock time in a system employing a conventional Institute of Electrical and Electronics Engineers (IEEE) 1588 Precision Time Protocol (PTP) (IEEE 1588 PTP).

FIG. 9 illustrates a diagram of an example graph 900 comparing simulation time and master clock time in a system employing a conventional IEEE 1588 PTP. As can be seen in the graph 900, over time, as the number of cycles increases (shown on the x-axis) the time of the master clock can drift further and further away from the simulation time (wherein time is shown along the y-axis).

Figure 10:
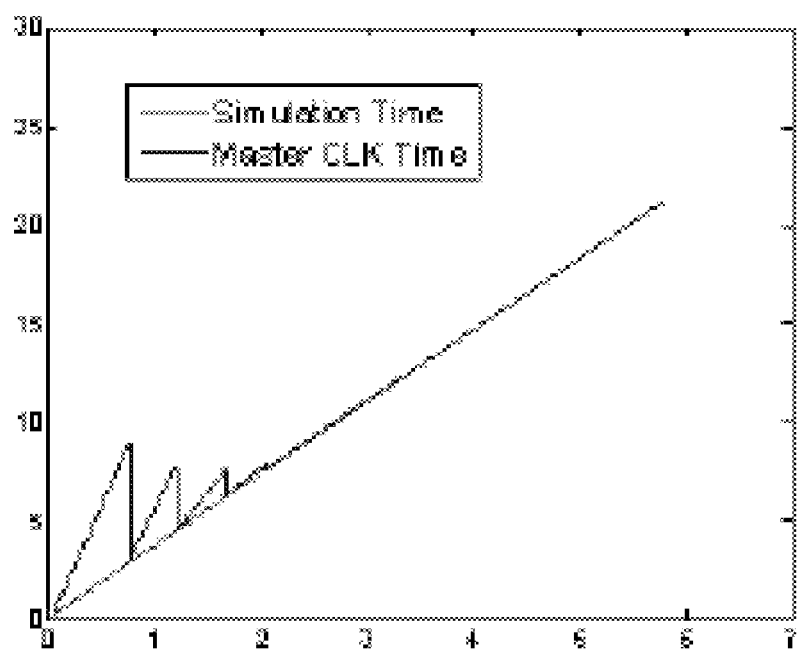
FIG. 10 depicts an example graph that compares simulation time and master clock time in a system employing the modified IEEE 1588 PTP and the predictor component.

FIG. 10 depicts a diagram of an example graph 1000 that compares simulation time and master clock time in a system employing the modified IEEE 1588 PTP and also employing the predictor component, as disclosed herein. As can be seen in the graph 1000, over time, as the number of cycles increases (shown on the x-axis) the master clock time can more accurately track or be in line with the simulation time (wherein time is shown along the y-axis) to the point where the master clock time can be virtually the same as the simulation time after approximately two cycles.

In accordance with an embodiment of the disclosed subject matter, one or more components (e.g., SMC) in the simulation environment can utilize artificial intelligence (AI) techniques or methods to infer (e.g., reason and draw a conclusion based at least in part on a set of metrics, arguments, or known outcomes in controlled scenarios) a length of time to be employed for a next simulation step; a clock that is to be selected as a master clock; an amount of PTP offset; etc. Artificial intelligence techniques typically can apply advanced mathematical algorithms—e.g., decision trees, neural networks, regression analysis, principal component analysis (PCA) for feature and pattern extraction, cluster analysis, genetic algorithm, and reinforced learning—to historic and/or current data associated with the systems and methods disclosed herein to facilitate rendering an inference(s) related to the systems and methods disclosed herein.

In particular, the one or more components in the communication network environment can employ one of numerous methodologies for learning from data and then drawing inferences from the models so constructed, e.g., Hidden Markov Models (HMMs) and related prototypical dependency models. General probabilistic graphical models, such as Dempster-Shafer networks and Bayesian networks like those created by structure search using a Bayesian model score or approximation can also be utilized. In addition, linear classifiers, such as support vector machines (SVMs), non-linear classifiers like methods referred to as "neural network" methodologies, fuzzy logic methodologies can also be employed. Moreover, game theoretic models (e.g., game trees, game matrices, pure and mixed strategies, utility algorithms, Nash equilibria, evolutionary game theory, etc.) and other approaches that perform data fusion, etc., can be exploited in accordance with implementing various automated aspects described herein. The foregoing techniques or methods can be applied to analysis of the historic and/or current data associated with systems and methods disclosed herein to facilitate making inferences or determinations related to systems and methods disclosed herein.

The aforementioned systems and/or devices have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

Referring to FIGS. 11-14, methodologies in accordance with various aspects of the disclosed subject matter are illustrated. While, for purposes of simplicity of explanation, the methodologies are shown and described as a series of acts, it is to be understood and appreciated that the disclosed subject matter is not limited by the order of acts, as some acts may occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the disclosed subject matter. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Figure 11:
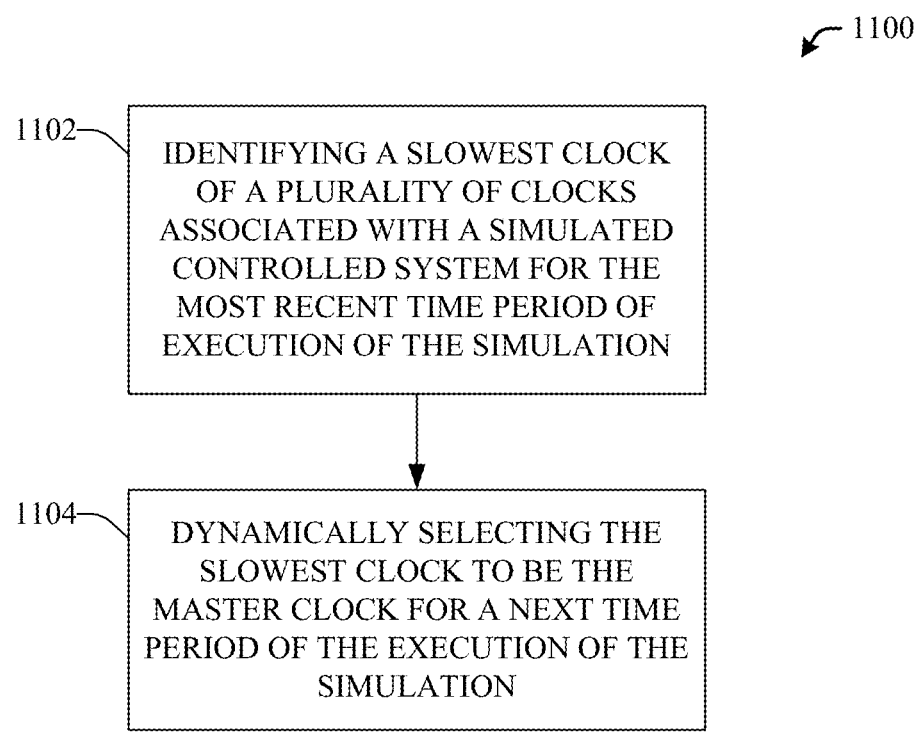
FIG. 11 illustrates a flow diagram of an example method for dynamically selecting a master clock for respective steps of a controlled system simulation in accordance with various aspects and embodiments of the disclosed subject matter.

Turning specifically to FIG. 11, illustrated is a flow diagram of an example method 1100 is illustrated for dynamically selecting a master clock for respective steps of a controlled system simulation in accordance with various aspects and embodiments of the disclosed subject matter. At 1102, a slowest clock of a plurality of clocks associated with a simulated controlled system (e.g., plant or process, which are desired to be controlled, and an associated controller(s) that controls them) can be identified for the most recent time period of execution of the simulation. Each of the clocks can be respectively associated with components, such as controllers (e.g., soft controllers) and simulation components, in the simulated controlled system. The controlled system simulation can be performed in a number of steps having respective lengths of time.

At 1104, the slowest clock can be dynamically selected to be the master clock for a next time period of the execution of the simulation. The next time period can be a desired length of time. In an aspect, a predictor component can predict the length of time for the next time period. The simulation can be performed in accordance with the modified IEEE 1588 standards, as disclosed herein. The clocks associated with the respective components of the controlled simulation system can have respective PTP offsets that can be determined based at least in part on the master clock to facilitate clock synchronization of all of the clocks associated with the simulation.

Figure 12:
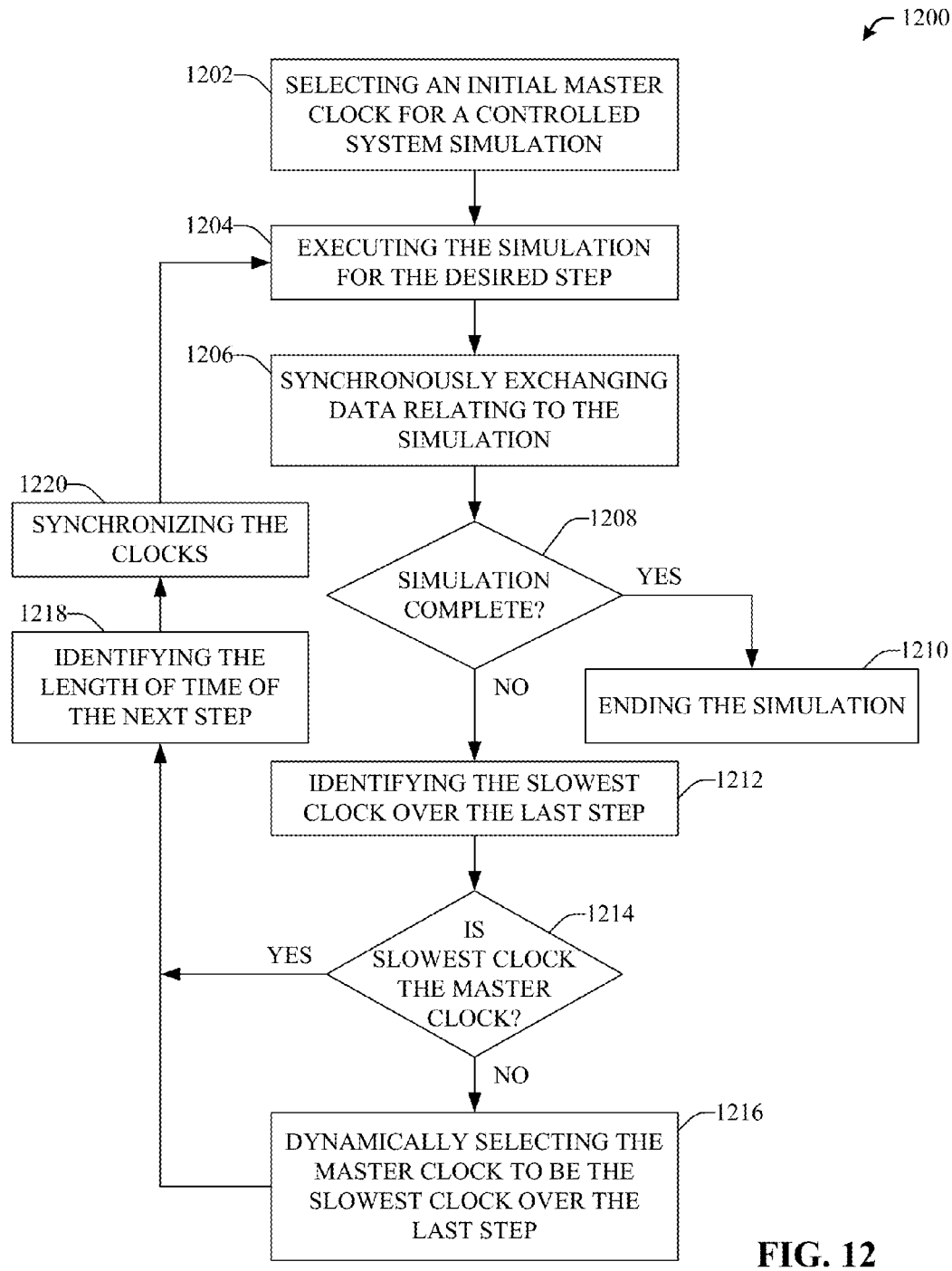
FIG. 12 depicts a flow diagram of an example method that can dynamically select a master clock for respective steps of a controlled system simulation in accordance with various aspects of the disclosed subject matter.

FIG. 12 illustrates another method 1200 that can dynamically select a master clock for respective steps of a controlled system simulation in accordance with various aspects of the disclosed subject matter. At 1202, an initial master clock can be selected for a controlled system simulation. For instance, the initial master clock can be selected as the clock that is most likely to be the slowest clock based at least in part on predefined simulation criteria. For example, known simulation information can be used to facilitate identifying which clock is to be the initial master clock. At 1204, the simulation can be executed for the desired step. During the simulation over the step, the various components can be operating to simulate the performance of desired respective functions, wherein data can be generated in relation to the simulated performance of those functions.

At 1206, data relating to the simulation can be exchanged synchronously. Depending on the control system design, and the functions that were performed during the step, data packets can be sent from one component to another component, wherein the components can be in the same node and there can be an intra-node data exchange, or the components can be in different nodes and there can be an inter-node exchange of data. The respective data packets each can be associated with respective times (e.g., by time stamping each of the data packets), and, when the data packets are received by a queue associated with the receiving component, the data packets can be re-arranged in the queue in order of their respective times (e.g., from oldest data packet first through newest data packet last).

At 1208, a determination can be made regarding whether the simulation is complete. If the simulation is complete (e.g., no more simulation steps to perform), at 1210, the simulation can end. If at 1208, it is determined that the simulation is not complete, at 1212, the slowest clock over the last step can be identified. For instance, the SMC can identify the clock that was running the slowest relative to the other clocks over the last simulation step in the simulated control system. In an aspect, during a time step in the simulation, the controllers or simulation components, which are faster than the slowest component of the simulated controlled system, can wait for the slowest component to finish the execution for that time step before proceeding on with the simulation. For example, if the slowest component takes 50 ms to execute 10 ms of realtime during the time step, the faster components, which took less than 50 ms to execute the 10 ms of realtime, can wait until the slowest component has completed execution of the 10 ms of realtime for that time step before proceeding on with the controlled system simulation.

At 1214, a determination can be made regarding whether the slowest clock over the last step is the current master clock. If it is determined that the slowest clock over the last step is not the current master clock, at 1216, the master clock can be dynamically selected or switched to be the slowest clock over the last step. At 1218, the length of time of the next step can be identified. In an aspect, the length of time of the next step can be predicted, for example, using a desired predictor component that can employ an adaptive filter to facilitate identifying the length of time of the next step, as disclosed herein. At 1220, the other clocks in the controlled system simulation can be synchronized in relation to the master clock in accordance with a desired protocol. At this point, method 1200 can return to act 1204, wherein the simulation can be executed for the next step, and method 1200 can continue from that point.

Referring again to act 1214, if it is determined that the slowest clock over the last step is the current master clock, the current master clock can continue to be the master clock for the next step, and method 1200 can proceed to act 1218, and can proceed from that point to identify the length of time of the next step of the simulation, synchronize the clocks at act 1220, and proceed to act 1204, wherein the simulation can be executed for the next step, and method 1200 can continue from that point.

Figure 13:
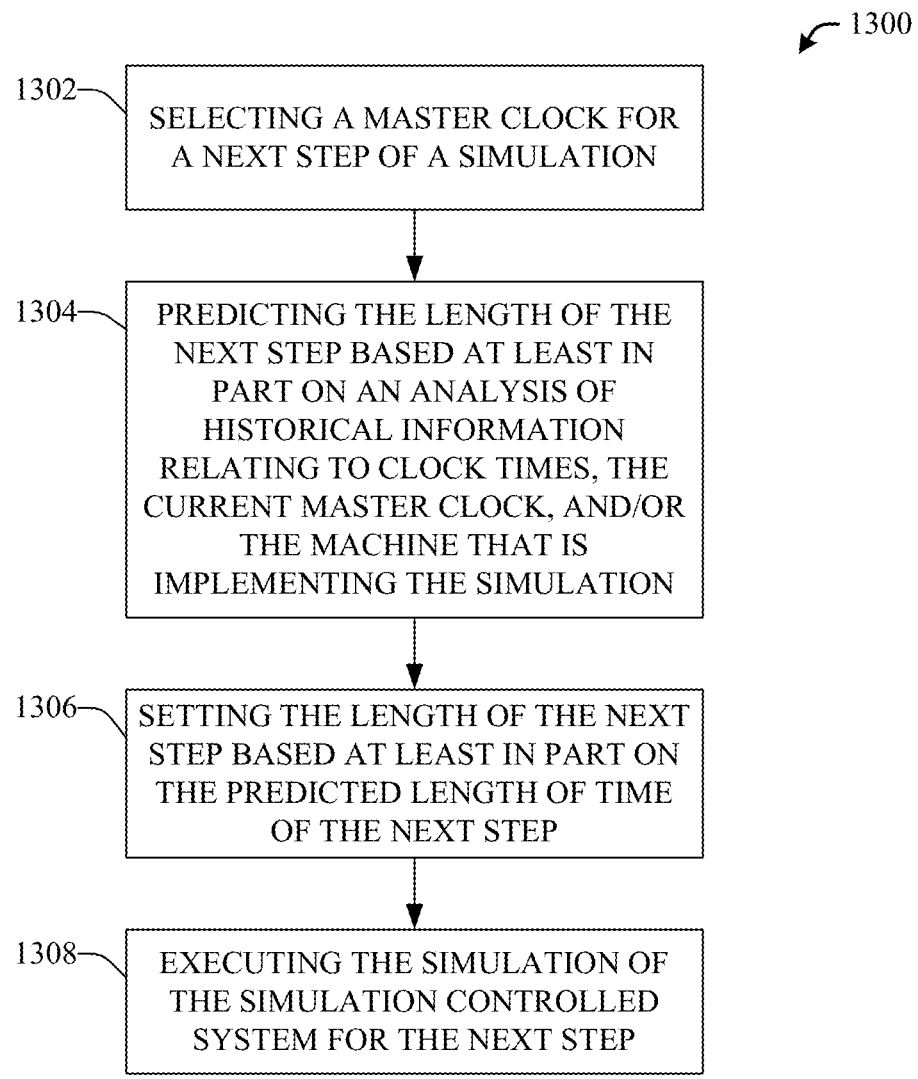
FIG. 13 illustrates a flow diagram of an example method that can predict a length of time for a next step in a controlled system simulation in accordance with various aspects of the disclosed subject matter.

FIG. 13 depicts a method 1300 that can predict a length of time for a next step in a controlled system simulation in accordance with various aspects of the disclosed subject matter. At 1302, a master clock can be selected for a next step of a simulation. In an aspect, the simulated controlled system can comprise a number of clocks that can be respectively associated with components (e.g., controllers, simulation components) in a simulated controlled system. The clock identified as being the slowest clock can be selected to be the master clock in accordance with the predefined simulation criteria. The modified IEEE 1588 PTP standards disclosed herein can be employed to facilitate performing the controlled system simulation.

At 1304, the length of the next step can be predicted based at least in part on an analysis of historical information relating to clock times, the current master clock, and/or the machine (e.g., computer) that is implementing the simulation. In an embodiment, a predictor component can employ a desired adaptive filter that can analyze the historical information and can generate a predicted length of time for the next step.

At 1306, the length of the next step can be set based at least in part on the predicted length of time of the next step. For instance, the length of the next step can be identified and set as the predicted length of time or as a function of the predicted length of time of the next step. At 1308, the simulation of the simulation controlled system can be executed for the next step. The controlled system simulation can be executed for the time period of the next step and can stop at the end of that time period, wherein, for example, there can be a synchronous exchange of data between various components in the simulated controlled system.

Figure 14:
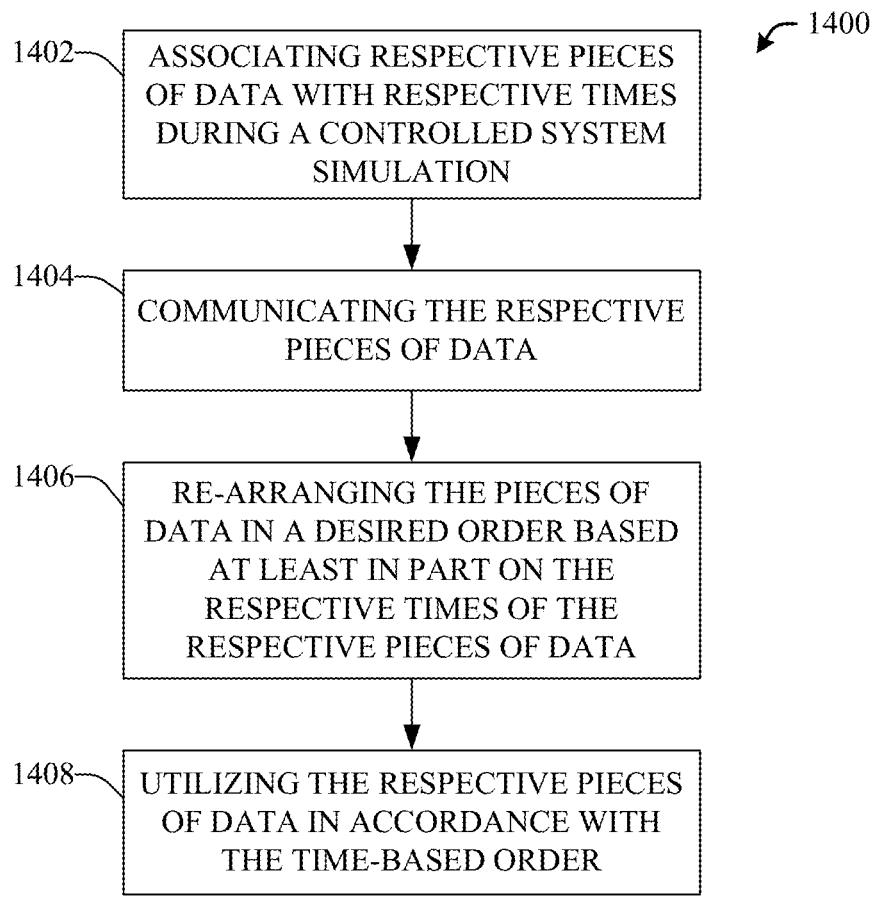
FIG. 14 depicts a flow diagram of an example method that can facilitate synchronous data exchange for a controlled system simulation in accordance with various aspects of the disclosed subject matter.

FIG. 14 illustrates a method 1400 that can facilitate synchronous data exchange for a controlled system simulation in accordance with various aspects of the disclosed subject matter. At 1402, respective pieces of data (e.g., data packets) can be associated with respective times during a controlled system simulation. During a portion (e.g., step) of a controlled system simulation, respective components (e.g., controllers, simulation components) can produce respective pieces of data, based at least in part on events that occur during the simulation. The respective pieces of data, which can be produced in response to the events that occurred, can be associated with respective times in accordance with the respective times that the respective events occurred during the simulation. For example, the respective pieces of data can be time stamped with the respective times that correspond with the respective simulation events that occurred.

At 1404, the respective pieces of data can be communicated. The piece(s) of data can be communicated from one component to another component that desires to receive such piece(s) of data. For example, a controller of a first node can send data to a component (e.g., controller, simulation component) of the first node or to a component of another node, or a simulation component of one node can send data to another component of the same node or to a component of a different node. At 1406, the pieces of data can be re-arranged in a desired order based at least in part on the respective times of the respective pieces of data. For instance, a component (e.g., controller, simulation component) can re-arrange received pieces of data in a consumer queue so that the respective pieces of data are arranged in accordance with their respectively associated times (e.g., time stamps). For example, the pieces of data can be arranged from data with the oldest associated time first in order to the last piece of data having the most recent associated time.

At 1408, the respective pieces of data can be used in accordance with the time-based order. For instance, the component that received the data can use the data during the simulation in accordance with the time-based order. As a result, synchronous data exchange between components in the simulated controlled system can be facilitated.

As used in this application, the terms "component" and "system", "agent", and the like can refer to a computer-related entity, either hardware, a combination of hardware and software, software, or software in execution. For example, a component may be, but is not limited to being, a process running on a processor, a processor, an object, an instance, an executable, a thread of execution, a program, and/or a computer. By way of illustration, both an application running on a computer and the computer can be a component. One or more components may reside within a process and/or thread of execution and a component may be localized on one computer and/or distributed between two or more computers.

Furthermore, the disclosed subject matter can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the disclosed subject matter.

Moreover, the word "exemplary" is used herein to mean serving as an example, instance, or illustration. Any aspect or design described herein as "exemplary" is not necessarily to be construed as preferred or advantageous over other aspects or designs.

Some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

Figure 15:
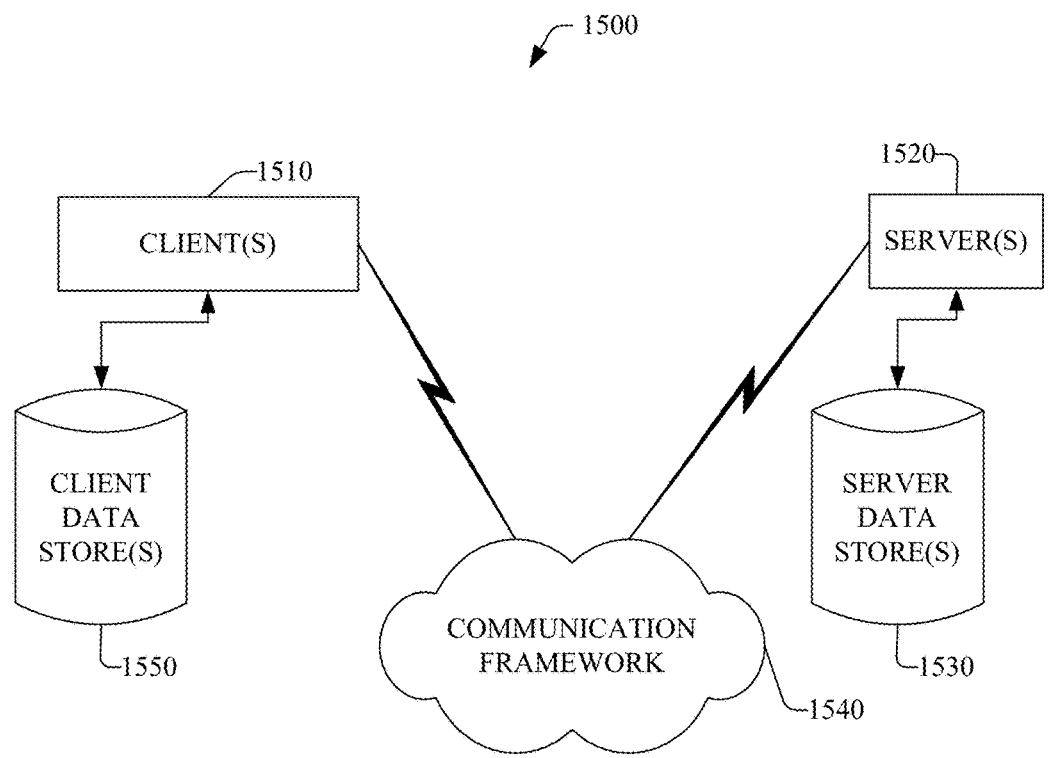
FIG. 15 illustrates a networking environment, wherein the aspects of the disclosed subject matter can be employed in accordance with the disclosed subject matter.
Figure 16:
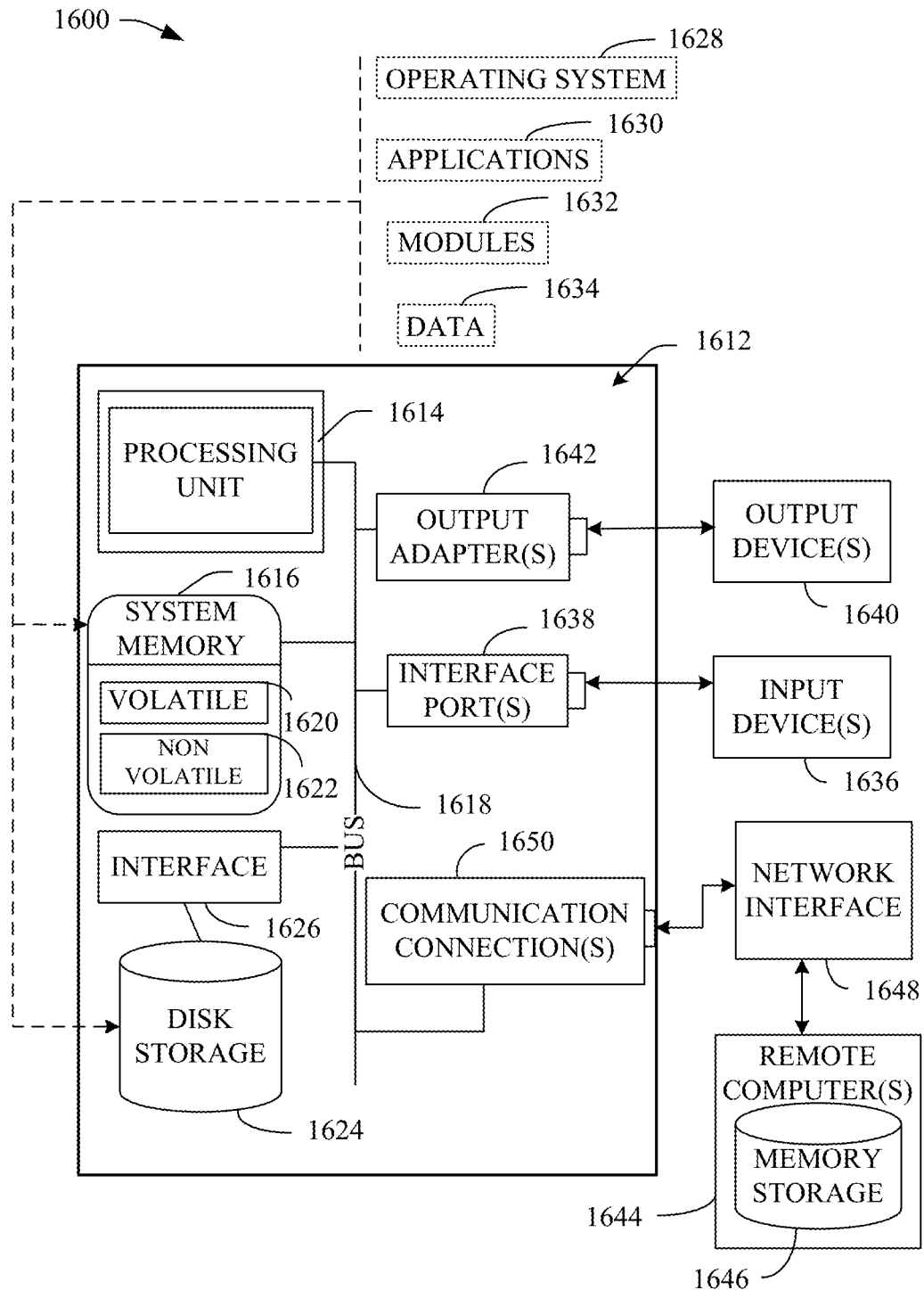
FIG. 16 illustrates an operating environment that can be employed in accordance with the disclosed subject matter.

In order to provide additional context for implementing various aspects of the disclosed subject matter, FIGS. 15 and 16 and the following discussion is intended to provide a brief, general description of a suitable computing environment in which the various aspects of the disclosed subject matter can or may be implemented. While the disclosed subject matter has been described above in the general context of computer-executable instructions of a computer program that runs on a local computer and/or remote computer, those skilled in the art will recognize that the disclosed subject matter also may be implemented in combination with other program modules. Generally, program modules include routines, programs, components, data structures, etc., that perform particular tasks and/or implement particular abstract data types.

Moreover, those skilled in the art will appreciate that the methods of the subject specification can be practiced with other computer system configurations, including single-processor or multi-processor computer systems, minicomputers, mainframe computers, as well as personal computers, hand-held computing devices, microprocessor-based and/or programmable consumer electronics, and the like, each of which may operatively communicate with one or more associated devices. The illustrated aspects of the disclosed subject matter also can be practiced in distributed computing environments where certain tasks are performed by remote processing devices that are linked through a communications network. However, some, if not all, aspects of the disclosed subject matter can be practiced on stand-alone computers. In a distributed computing environment, program modules can be located in local and/or remote memory storage devices.

FIG. 15 is a schematic block diagram of a sample-computing environment 1500 with which the disclosed subject matter can interact. The system 1500 includes one or more client(s) 1510. The client(s) 1510 can be hardware and/or software (e.g., threads, processes, computing devices). The system 1500 also includes one or more server(s) 1520. The server(s) 1520 can be hardware and/or software (e.g., threads, processes, computing devices). The servers 1520 can house threads to perform transformations by employing the disclosed subject matter, for example.

One possible communication between a client 1510 and a server 1520 can be in the form of a data packet adapted to be transmitted between two or more computer processes. The system 1500 includes a communication framework 1540 that can be employed to facilitate communications between the client(s) 1510 and the server(s) 1520. The client(s) 1510 are operably connected to one or more client data store(s) 1550 that can be employed to store information local to the client(s) 1510. Similarly, the server(s) 1520 are operably connected to one or more server data store(s) 1530 that can be employed to store information local to the servers 1520.

With reference to FIG. 16, an exemplary environment 1600 for implementing various aspects of the disclosed subject matter includes a computer 1612. The computer 1612 can include a processing unit 1614, a system memory 1616, and a system bus 1618. The system bus 1618 couples system components including, but not limited to, the system memory 1616 to the processing unit 1614. The processing unit 1614 can be any of various available processors. Dual microprocessors and other multiprocessor architectures also can be employed as the processing unit 1614.

The system bus 1618 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1616 includes volatile memory 1620 and nonvolatile memory 1622. The basic input/output system (BIOS), containing the basic routines to transfer information between elements within the computer 1612, such as during start-up, is stored in nonvolatile memory 1622. By way of illustration, and not limitation, nonvolatile memory 1622 can include read only memory (ROM), programmable ROM (PROM), electrically programmable ROM (EPROM), electrically erasable programmable ROM (EEPROM), or flash memory. Volatile memory 1620 includes random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1612 also includes removable/non-removable, volatile/non-volatile computer storage media. FIG. 16 illustrates, for example a disk storage 1624. Disk storage 1624 includes, but is not limited to, devices like a magnetic disk drive, floppy disk drive, tape drive, Jaz drive, Zip drive, LS-100 drive, flash memory card, or memory stick. In addition, disk storage 1624 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1624 to the system bus 1618, a removable or non-removable interface is typically used such as interface 1626.

It is to be appreciated that FIG. 16 describes software that acts as an intermediary between users and the basic computer resources described in the suitable operating environment 1600. Such software includes an operating system 1628. Operating system 1628, which can be stored on disk storage 1624, acts to control and allocate resources of the computer system 1612. System applications 1630 take advantage of the management of resources by operating system 1628 through program modules 1632 and program data 1634 stored either in system memory 1616 or on disk storage 1624. It is to be appreciated that the disclosed subject matter can be implemented with various operating systems or combinations of operating systems.

A user enters commands or information into the computer 1612 through input device(s) 1636. Input devices 1636 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1614 through the system bus 1618 via interface port(s) 1638. Interface port(s) 1638 include, for example, a serial port, a parallel port, a game port, and a universal serial bus (USB). Output device(s) 1640 use some of the same type of ports as input device(s) 1636. Thus, for example, a USB port may be used to provide input to computer 1612, and to output information from computer 1612 to an output device 1640. Output adapter 1642 is provided to illustrate that there are some output devices 1640 like monitors, speakers, and printers, among other output devices 1640, which require special adapters. The output adapters 1642 include, by way of illustration and not limitation, video and sound cards that provide a means of connection between the output device 1640 and the system bus 1618. It should be noted that other devices and/or systems of devices provide both input and output capabilities such as remote computer(s) 1644.

Computer 1612 can operate in a networked environment using logical connections to one or more remote computers, such as remote computer(s) 1644. The remote computer(s) 1644 can be a personal computer, a server, a router, a network PC, a workstation, a microprocessor based appliance, a peer device or other common network node and the like, and typically includes many or all of the elements described relative to computer 1612. For purposes of brevity, only a memory storage device 1646 is illustrated with remote computer(s) 1644. Remote computer(s) 1644 is logically connected to computer 1612 through a network interface 1648 and then physically connected via communication connection 1650. Network interface 1648 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1650 refers to the hardware/software employed to connect the network interface 1648 to the bus 1618. While communication connection 1650 is shown for illustrative clarity inside computer 1612, it can also be external to computer 1612. The hardware/software necessary for connection to the network interface 1648 includes, for exemplary purposes only, internal and external technologies such as, modems including regular telephone grade modems, cable modems and DSL modems, ISDN adapters, and Ethernet cards.

What has been described above includes examples of the disclosed subject matter. It is, of course, not possible to describe every conceivable combination of components or methodologies for purposes of describing the disclosed subject matter, but one of ordinary skill in the art may recognize that many further combinations and permutations of the disclosed subject matter are possible. Accordingly, the disclosed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosed subject matter. In this regard, it will also be recognized that the disclosed subject matter includes a system as well as a computer-readable medium having computer-executable instructions for performing the acts and/or events of the various methods of the disclosed subject matter.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

In the subject specification, terms such as "data store," data storage," "database," and substantially any other information storage component relevant to operation and functionality of a component, refer to "memory components," or entities embodied in a "memory" or components comprising the memory. For example, information relevant to operation of various components described in the disclosed subject matter, and that can be stored in a memory, can comprise, but is not limited to comprising, subscriber information; cell configuration (e.g., devices served by an AP) or service policies and specifications; privacy policies; and so forth. It will be appreciated that the memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), phase change memory (PCM), flash memory, or nonvolatile RAM (e.g., ferroelectric RAM (FeRAM)). Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

In addition, while a particular feature of the disclosed subject matter may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

What is claimed is:

1. A system, comprising:
   a memory that stores computer-executable components; and
   a processor, operatively coupled to the memory, that executes computer-executable components, the computer-executable components comprising:
   a set of clocks comprising a first clock associated with a controller and a second clock associated with a simulation component that performs a simulation of a controlled system, wherein the simulation comprises a set of acts, comprising a last act and a next act, relating to respective portions, comprising a last portion and a next portion, of performance of the simulation; and
   a simulation management component that selects a clock of the set of clocks to be used as a master clock for the next act of the simulation based at least in part on a determination that a speed of the clock is slowest relative to respective speeds of other clocks of the set of clocks during the last act, wherein the determination that the speed of the clock is the slowest is based at least in part on a message generated by a coordinator agent and communicated to at least one federated agent associated with the simulation management component, wherein the message indicates the speed of the clock associated with a node is detected to be the slowest during the last act, wherein the clock is one of the first clock or the second clock, wherein the other clocks are synchronized in relation to the master clock, and wherein the simulation management component performs the next act of the simulation using the master clock and the other clocks synchronized in relation to the master clock.

2. The system of claim 1, wherein the simulation management component receives respective time-related information for the last act from respective nodes associated with respective clocks of the set of clocks and determines the clock of the set of clocks is the slowest clock over the last act based at least in part on a result of an analysis of the respective time-related information, wherein the respective nodes comprise the node.

3. The system of claim 1, wherein the computer-executable components further comprise a federated agent that is associated with the node, wherein the federated agent detects at least one other federated agent associated with at least one other node and associates with the at least one other federated agent to form a virtual coordination cluster of federated agents to facilitate communication of information between the federated agent and the at least one other federated agent to facilitate operation of the simulation of the controlled system, and wherein the at least one federated agent comprises the federated agent.

4. The system of claim 1, wherein the at least one federated agent comprises a federated agent, wherein the coordinator component detects the clock, associated with a component in the node, as being the slowest during the last act and sends the message to the federated agent in the node to facilitate the determination of the clock to be the master clock for the next act, wherein the federated agent propagates the message to at least one other federated agent associated with at least one other node, wherein the node comprises a subset of the set of clocks, and wherein the component is one of the controller or the simulation component.

5. The system of claim 4, wherein, in response to the message, the federated agent and the at least one other federated agent communicate information between each other to facilitate stalling operation of the node and the at least one other node, wherein the at least one other federated agent is associated with the at least one other node; selecting the clock as the master lock for the next act of the simulation; modifying respective time offsets associated with respective components of the node and the at least one other node; and continuing operation of the node and the at least one other node to facilitate continuing the simulation of the controlled system.

6. The system of claim 1, wherein the computer-executable components further comprise a predictor component that predicts a length of time of the next act of the simulation of the controlled system to generate a predicted length of time of the next act based at least in part on historical data relating to the controller or a previous length of time of a previous act associated with the simulation, wherein the simulation management component determines the length of time of the next act as a function of the predicted length of time.

7. The system of claim 6, wherein the predictor component employs an adaptive filter to facilitate the predicting of the length of time of the next act.

8. The system of claim 1, wherein the coordinator agent determines an amount of a time offset for another component that is associated with another clock that was operating at a faster speed relative to the clock during the last act, wherein the other component is part of the node, and the other clock is in the set of clocks.

9. The system of claim 1, wherein the coordinator agent facilitates synchronized communication of data between a component and at least one other component to facilitate the simulation of the controlled system, wherein the component is one of the controller or the simulation component.

10. The system of claim 9, wherein the computer-executable components further comprise a queue component that receives the data, comprising a set of data packets, and arranges respective data packets of the set of data packets in order of time, based at least in part on respective time information associated with the respective data packets, to facilitate synchronized use of the data, wherein the respective time information indicates respective periods of time in the simulation to which the respective data packets relate.

11. The system of claim 9, wherein the coordinator agent generates a tag mapping based at least in part on first registration data associated with the component and second registration data associated with the at least one other component to associate the component with the at least one other component to facilitate an exchange of a portion of the data between the component and the at least one other component to facilitate the synchronized communication of the portion of the data.

12. A method, comprising:
identifying, by a system comprising a processor, a clock of a set of clocks associated with a simulation of a controlled system that is a slowest clock for a previous time interval of a previous portion of the simulation of a set of portions of the simulation in response to a message received by an agent from a coordinator agent, wherein the message indicates a speed of the clock is identified to be slowest relative to respective speeds of other clocks of the set of clocks for the previous time interval; and
in response to identifying the clock as the slowest clock for the previous time interval, selecting, by the system, the clock to be the master clock for a next time interval of a next portion of the simulation of the set of portions of the simulation, wherein the other clocks are synchronized with respect to the master clock, and wherein the next portion of the simulation is performed using the master clock and the other clocks synchronized with respect to the master clock.

13. The method of claim 12, wherein a subset of the set of clocks comprises the clock and another clock, and the subset of clocks is associated with a node that is associated with the simulation of the controlled system, wherein the message is generated in response to identifying the clock as operating at a slowest speed in the node relative to another speed of the other clock during the previous time interval, and wherein the method further comprises:
communicating, by the system, the message from the coordinator agent to the agent to facilitate the selecting of the clock to be the master clock for the next time interval of the next portion of the simulation.

14. The method of claim 12, further comprising:
predicting, by the system, a length of the next time interval based at least in part on historical information associated with a controller employed to facilitate the simulation of the controlled system;
determining, by the system, the length of the next time interval based at least in part on the predicting of the length of the next time interval; and performing, by the system, the next portion of the simulation of the controlled system for the next time interval based at least in part on the length of the next time interval.

15. The method of claim 12, wherein the clock is associated with a component associated with the simulation, and wherein the method further comprises:
determining, by the system, an amount of a time delay for use in connection with another component associated with the simulation during the next time interval, wherein the other component is associated with another clock that was operating at a faster speed relative to the speed of the clock during the previous time interval, and wherein the other clock is in the set of clocks.

16. The method of claim 12, further comprising:
receiving, by the system, a first piece of simulation data associated with first time information associated with the simulation and a second piece of simulation data associated with second time information associated with the simulation at a node associated with the simulation of the controlled system;
arranging, by the system, the first piece of simulation data and the second piece of simulation data in a queue of the node in a defined time order, based at least in part on the first time information and the second time information, to facilitate synchronization of simulation data associated with the simulation; and
utilizing, by the system, the first piece of simulation data and the second piece of simulation data in the queue in accordance with the defined time order.

17. The method of claim 16, wherein the receiving the first piece of simulation data and the second piece of simulation data further comprises:
receiving, by the system, the first piece of the simulation data from a first component that is part of the node as part of an intra-node data exchange; and
receiving, by the system, the second piece of the simulation data from a second component that is part of a second node associated with the simulation as part of an inter-node data exchange.

18. The method of claim 12, further comprising:
determining, by the system, whether the clock identified as the slowest clock for the previous time interval was the master clock for the previous time interval; and
in response to determining that the clock identified as the slowest clock for the previous time interval was not the master clock for the previous time interval, switching, by the system, the master clock from a different clock of the set of clocks to the clock, wherein the different clock was determined to be the master clock during the previous time interval.

19. A system, comprising:
means for determining a clock of a set of clocks associated with a simulation of a controlled system that is a slowest clock for a previous time period of a previous portion of the simulation of a set of portions of the simulation based at least in part on a message communicated from a coordinator agent to another agent associated with the means for determining the clock, wherein the message indicates an operational speed of the clock is determined to be slowest relative to at least other operational speeds of other clocks associated with a node during the previous portion of the simulation, and wherein the node is associated with a subset of the set of clocks comprising the clock and the other clocks; and means for selecting the clock to be the master clock for a next time period of a next portion of the simulation of the set of portions of the simulation in response to determining the clock to be the slowest clock for the previous time period, wherein the other clocks are synchronized in relation to the master clock and wherein the next portion of the simulation is performed using the master clock and the other clocks synchronized with respect to the master clock.

20. The system of claim 19, further comprises:
means for generating the message, wherein the message is communicated from the coordinator agent to the other agent to facilitate selecting the clock to be the master clock during the next time period of the next portion of the simulation.

* * * * *